(12) United States Patent  
Hiroki

(10) Patent No.: US 7,583,094 B2  
(45) Date of Patent: Sep. 1, 2009

(54) METHOD FOR FABRICATING LIGHT-EMITTING DEVICE THROUGH INSPECTION

(75) Inventor: Masaaki Hiroki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/455,156

(22) Filed: Jun. 19, 2006

(65) Prior Publication Data

US 2006/0232261 A1    Oct. 19, 2006

Related U.S. Application Data

(62) Division of application No. 10/810,646, filed on Mar. 29, 2004, now Pat. No. 7,068,055, which is a division of application No. 09/866,651, filed on May 30, 2001, now Pat. No. 6,729,922.

(30) Foreign Application Priority Data

Jun. 5, 2000    (JP)    ............................. 2000-168143

(51) Int. Cl.  
  *G01R 31/02* (2006.01)
(52) U.S. Cl. ...................... 324/750; 324/765
(58) Field of Classification Search ......... 324/750–753, 324/765, 501–514, 73.1, 158.1; 250/309; 438/14–18; 372/9
  See application file for complete search history.

(56) References Cited

U.S. PATENT DOCUMENTS

| 4,398,343 A | 8/1983 | Yamazaki |
| 4,575,676 A * | 3/1986 | Palkuti ........................ 324/750 |
| 4,630,274 A * | 12/1986 | Schafer ........................... 372/9 |
| 5,111,043 A * | 5/1992 | Shigenaka et al. .......... 250/306 |
| 5,179,279 A | 1/1993 | Millard et al. |
| 5,202,623 A * | 4/1993 | LePage ........................ 324/758 |
| 5,233,291 A | 8/1993 | Kouno et al. |
| 5,371,459 A | 12/1994 | Brunner et al. |
| 5,537,054 A | 7/1996 | Suzuki et al. |
| 5,570,031 A * | 10/1996 | Sasaki et al. ................. 324/750 |
| 5,680,056 A | 10/1997 | Ito et al. |
| 5,897,378 A | 4/1999 | Eriguchi |
| 5,982,190 A | 11/1999 | Toro-Lira |
| 6,051,185 A * | 4/2000 | Beers ........................... 422/22 |
| 6,118,285 A | 9/2000 | Parker et al. |
| 6,184,623 B1 * | 2/2001 | Sugai et al. ............. 315/111.21 |
| 6,194,907 B1 | 2/2001 | Kanao et al. |
| 6,320,401 B1 | 11/2001 | Sugimoto et al. |
| 7,068,055 B2 * | 6/2006 | Hiroki ........................ 324/750 |

* cited by examiner

*Primary Examiner*—Vinh P Nguyen  
(74) *Attorney, Agent, or Firm*—Eric J. Robinson; Robinson Intellectual Property Law Office, P.C.

(57) ABSTRACT

A light-emitting device is produced at a decreased cost by inspecting defects in the pixels in the step of fabrication. TFTs possessed by the pixels on the element substrate and TFTs possessed by the peripheral drive circuits are inspected by using the inspection device to detect defects in a step in a process for finishing the light-emitting device. This makes it possible to decrease the loss that results when the defective products are processed through up to the final step, and to improve the yield by repairing the defective products in a step of repairing.

24 Claims, 18 Drawing Sheets

ENLARGED DIAGRAM OF 105

ENLARGED DIAGRAM OF 106

| (1, 1) | (2, 1) | (3, 1) | (4, 1) | | (x-1, 1) | (x, 1) |
|---|---|---|---|---|---|---|
| (1, 2) | (2, 2) | (3, 2) | (4, 2) | | (x-1, 2) | (x, 2) |
| (1, 3) | (2, 3) | (3, 3) | (4, 3) | | (x-1, 3) | (x, 3) |
| (1, 4) | (2, 4) | (3, 4) | (4, 4) | | (x-1, 4) | (x, 4) |
| | | | | | | |
| (1, y-1) | (2, y-1) | (3, y-1) | (4, y-1) | | (x-1, y-1) | (x, y-1) |
| (1, y) | (2, y) | (3, y) | (4, y) | | (x-1, y) | (x, y) |

FORMATION OF ISLAND SEMICONDUCTOR LAYER, GATE-INSULATING FILM, AND FIRST AND SECOND CONDUCTING FILMS FOR GATE ELECTRODES

FIRST ETCHING AND FIRST DOPING

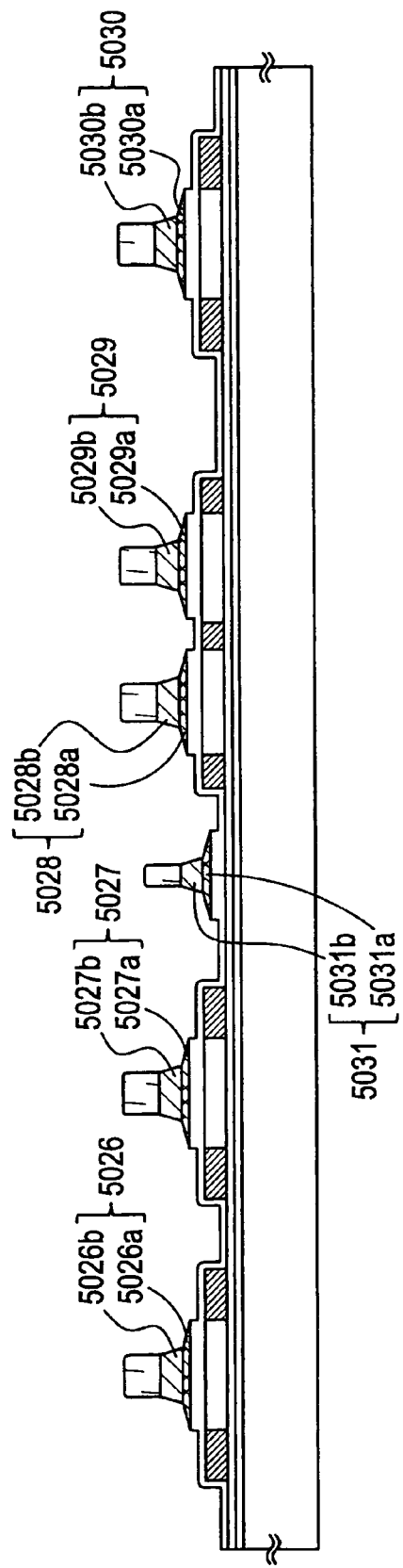

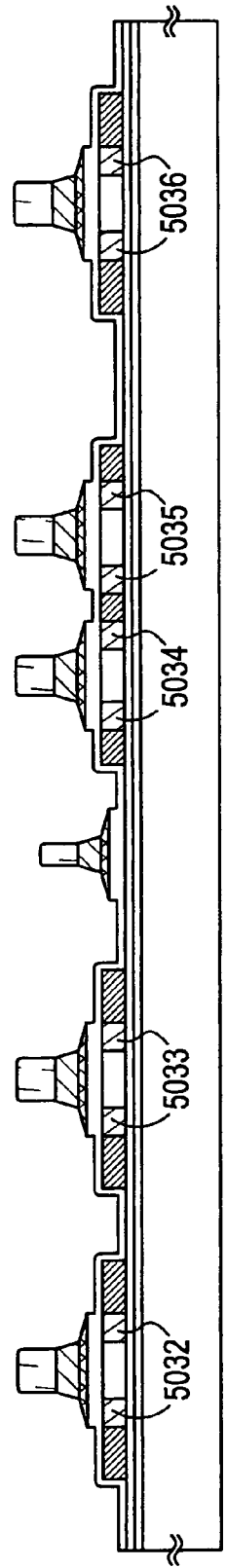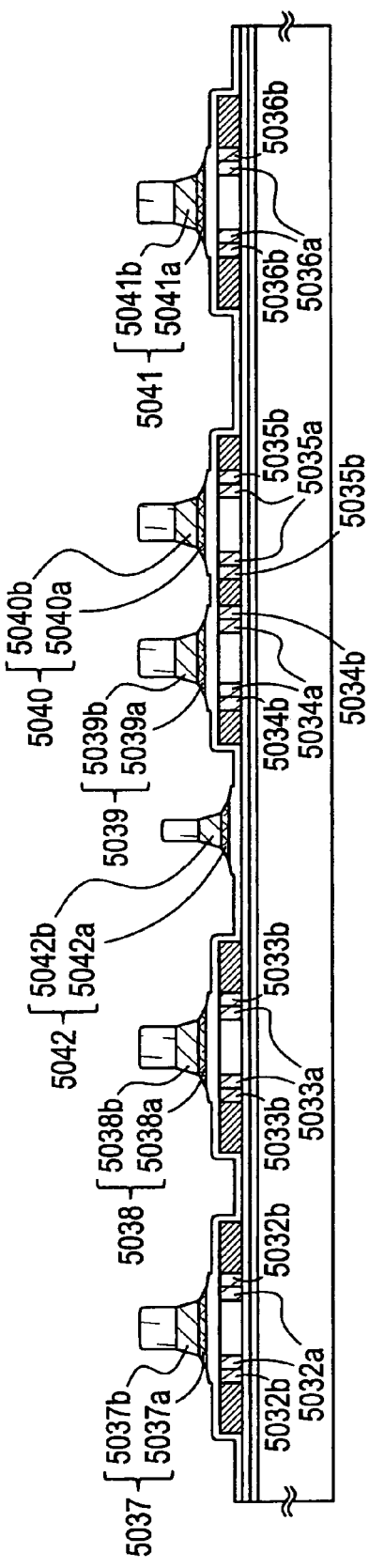

THIRD DOPING

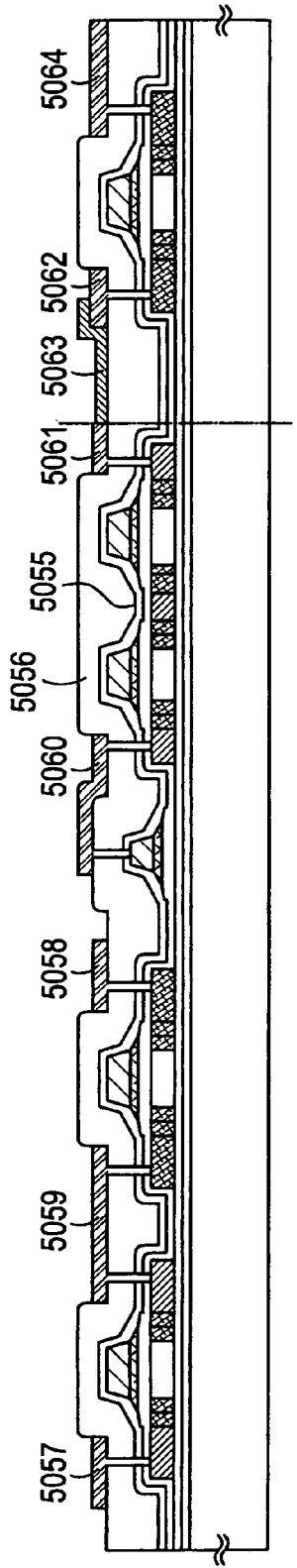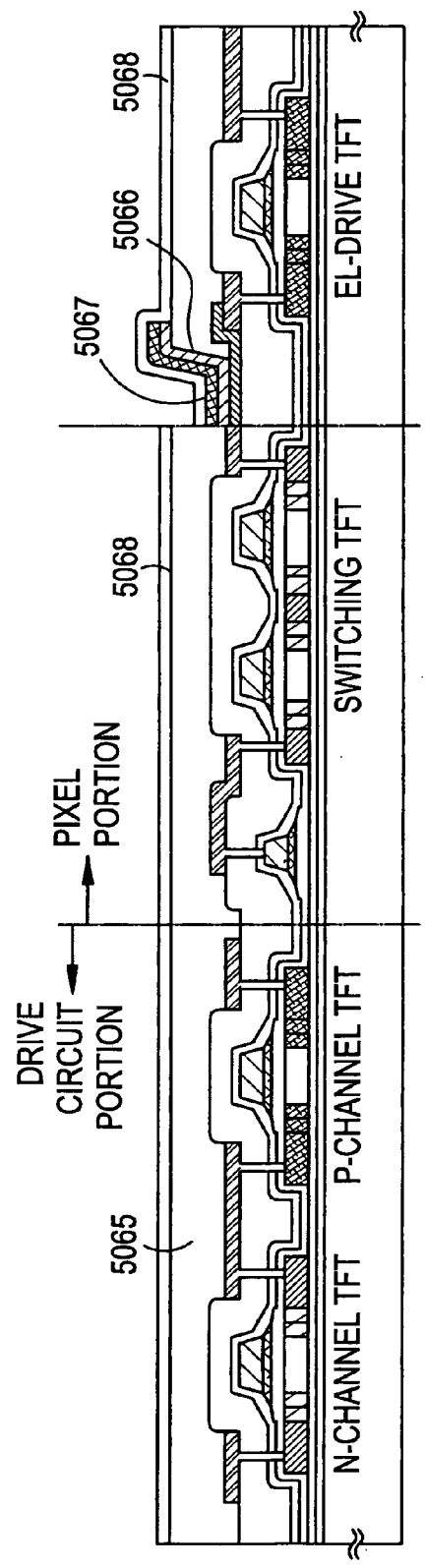

METHOD FOR FABRICATING LIGHT-EMITTING DEVICE THROUGH INSPECTION

This Application is a DIV. of application Ser. No. 10/810, 646, filed on Mar. 29, 2004, now U.S. Pat. No. 7,068,055, which is a DIV of application Ser. No. 09/866,651, filed on May 30, 2001, Now U.S. Pat. No. 6,729,922.

BACKGROUND OF THE INVENTION

1. Field of the Invention

This invention relates to a device for inspecting whether a pixel portion properly operates prior to forming an EL (electroluminescence) element in a light-emitting device in which the EL element is formed on a substrate and to a method of inspection. The EL (electroluminescent) devices referred to in this specification include triplet-based light emission devices and/or singlet-based light emission devices, for example. More particularly, the invention relates to a device for inspecting whether the pixel portion properly operates prior to forming an EL element in a light-emitting device that uses a semiconductor element (using a thin semiconductor film), to a method of inspection, to a method of fabricating the light-emitting device that incorporates the inspection method in one of the fabrication steps and to the light-emitting device fabricated by using the above fabrication method.

The EL element according to this invention has a structure in which an EL layer is sandwiched between a pair of electrodes. The EL layer stands for a layer containing an organic compound that emits fluorescent light or phosphorescent light upon the application of an electric field.

The light-emitting device to be inspected by the inspection device of this invention stands for an image display device or a light-emitting device using an EL element. Further, the light-emitting device encompasses all of those modules in which a connector such as an anisotropic electrically conducting film (FPC: flexible printed circuit), a TAB (tape automated bonding) tape or a TCP (tape carrier package) is attached to the EL element, modules in which a printed wiring board is provided at an end of the TAB tape or the TCP, or the modules in which an IC (integrated circuit) is directly mounted on the EL element by a COG (chip-on-glass) system.

2. Description of the Prior Art

In recent years, technology has been greatly advanced concerning forming TFTs (thin-film transistors) on a substrate, and attempts have been made to apply the technology to the active matrix display devices (light-emitting devices). In particular, the TFT using a polysilicon film exhibits a field-effect mobility (also called mobility) which is higher than that of the conventional TFT using an amorphous silicon film, and makes it possible to accomplish a high-speed operation. This makes it possible to control the pixels that had been controlled by a drive circuit outside the substrate by using a drive circuit formed on the same substrate as the pixels.

In the active matrix light-emitting device, various circuits and elements are formed on the same substrate to obtain various advantages such as decreasing the cost of production, decreasing the size of the electro-optical device, increasing the yield and decreasing the throughput.

Further, study has been vigorously forwarded concerning the active matrix light-emitting device (inclusive of EL display) having an EL element as a self-light-emitting element. The light-emitting device is also called an organic EL display (OELD) or an organic light-emitting diode (OLED).

The EL element possessed by the light-emitting device has a structure in which the EL layer of an organic compound is sandwiched between a pair of electrodes (cathode and anode). Here, however, the EL layer usually has a laminated-layer structure. A representative example may be a laminated-layer structure of "positive hole-transporting layer/light-emitting layer/electron-transporting layer" proposed by Tang et al. of Codak Eastman Co. This structure features a very high light-emitting efficiency. Most of the light-emitting devices that have now been studied and developed are employing this structure.

There may be further employed a structure in which the positive hole-injection layer/positive hole-transporting layer/light-emitting layer/electron-transporting layer or positive hole-injection layer/positive hole-transporting layer/light-emitting layer/electron-transporting layer/electron injection layer are laminated on the anode in order mentioned. The light-emitting layer may be doped with a fluorescent pigment.

In this specification, the layers provided between the cathode and the anode are all called EL layers. Therefore, the above positive hole-injection layer, positive hole-transporting layer, light-emitting layer, electron-transporting layer and electron injection layer all pertain to the EL layers.

A predetermined voltage is applied from a pair of electrodes to the EL layer of the above structure, whereby the carriers are recombined in the light-emitting layer to emit light. In this specification, a light-emitting element formed by the anode, EL layer and cathode is called EL element.

The EL layer possessed by the EL element is deteriorated by heat, light, moisture and oxygen. In fabricating the active matrix light-emitting device, therefore, the EL element is formed after the wiring and TFT are formed in the pixel portion.

After the EL element is formed, the substrate (EL panel) on which the EL element is provided and a cover member are stuck and sealed (packaged) together with a sealing member in a manner that the EL element is not exposed to the external air.

After the air-tightness is heightened by the treatment such as packaging, a connector (FPC, TAB, etc.) is attached for connecting the terminals drawn from the element or the circuit formed on the substrate to the external signal terminals, thereby to complete the active matrix light-emitting device.

In the active matrix light-emitting device, however, a predetermined voltage (current flowing into the EL layer) applied to the EL layer from the pair of electrodes of the EL element is controlled by a transistor provided in each of the pixels. Therefore, if some trouble occurs such as failure of the function of the transistor in the pixel portion, break or short-circuiting of the wiring, the predetermined voltage (current) is no longer applied to the EL layer possessed by the EL element. In such a case, the pixel no longer displays a desired gradation.

Even when the wiring or the transistor for controlling the emission of light from the EL element is defective in the pixel portion, however, it is not possible to make sure the presence of the defect until the light-emitting device is completed and is really used to make a display. In order to make a distinction from the acceptable products by inspection, therefore, the EL element must be completed though it may include a pixel portion that does not serve as a completed product, the packaging must be effected, and the connector must be attached to complete it as the light-emitting device. In this case, the step of forming the EL element, the step of packaging and the step of attaching the connector are wasted, resulting in a loss of time and cost. Even when the EL panel is formed by using a multi-chamfered substrate, the step of packaging and the step of attaching the connector are wasted, similarly, resulting in the loss of time and cost.

In the active matrix liquid crystal displays that are mass-produced earlier than the active matrix light-emitting devices, it has been done to form the wiring and TFT in the pixel portion prior to completing the liquid crystal display by introducing the liquid crystals into between the two substrates, to electrically charge the capacitors possessed by the pixels, and to measure the amount of electric charge for each of the pixels to make sure the presence of defects in the pixel portions.

In the active matrix light-emitting devices, however, not less than two TFTs are generally included in each pixel. One electrode (pixel electrode) and the capacitor in the EL element are often connected together with the transistors sandwiched therebetween. In this case, measurement of the amount of electric charge stored in the capacitor does not help make sure if the wiring and transistor connected between the capacitor and the pixel electrode are defective. In the case of the light-emitting device, further, an electric current must be supplied to the EL element and, hence, it is necessary to measure the electric current that flows.

It has been urged to establish the method of inspecting whether the wiring and transistor in the pixel portion are defective or, in other words, whether a predetermined voltage can be applied (or, whether a predetermined current can be supplied) to the pixel electrode of the EL element of each pixel prior to completing the light-emitting device in a process toward mass-producing the active matrix light-emitting devices.

SUMMARY OF THE INVENTION

The inspection method utilizing electromagnetic waves disclosed in this specification inspects any defect in the semiconductor element formed on the element substrate and in the pixels and wirings formed like a matrix which are connected to the semiconductor element.

In this specification, the element substrate refers to the one on which there are formed the pixel electrodes connected to the semiconductor elements among the pixels that are independently formed in the pixel portion after the wirings and the semiconductor elements have been formed on the substrate. The semiconductor element stands for an element which, by itself or in a plural number, constitutes a switching function of a semiconductor material, as represented by a transistor and, particularly, by a field-effect transistor, typically MOS (metal oxide semiconductor) transistor or a thin-film transistor (TFT). Accordingly, both the semiconductor substrate on which the MOS transistor is formed and the substrate on which the TFT is formed pertain to the element substrates.

Among the wirings possessed by the pixel portion, the gate signal lines are successively selected to successively input the signals having the same potential to the source signal lines in a state where all of the current feed lines are maintained at the same potential, in order to successively select all of the pixels. In this specification, the pixel that is selected means that a video signal is input to the source signal line possessed by the pixel in a state where the gate signal line possessed by the pixel is selected.

Further, an opposing detector substrate is provided on the element substrate, and electromagnetic waves (preferably, an X-rays) are radiated from an electromagnetic wave source 101 to a gas between the opposing detector substrate 102 and the element substrate 103 as shown in FIG. 1(A). The electromagnetic wave source is the one capable of generating electromagnetic waves. When the electromagnetic waves are generated, a gas (air in this case) is ionized due to the electromagnetic waves, whereby ions are generated and an electric path is established along which a current flows. In this specification, the opposing detector substrate stands for the one on which is formed an electrode through which a current flows into the pixel electrode possessed by the pixel on the element substrate. The electrode formed on the opposing detector substrate is called opposing detector electrode. Further, a current-flowing state stands for the one in which the current flowing into the pixel electrode of the element substrate, flows into the opposing detector electrode of the opposing detector substrate.

When a pixel is selected on the element substrate 103, the selected pixel is connected to the opposing detector substrate 102. That is, upon successively selecting the pixels on the element substrate, the pixels can be electrically connected to the opposing detector substrate 102 corresponding thereto. In detecting the current flowing into a particular pixel on the element substrate as shown in FIG. 1(A), a position at where the current flowing into the element substrate can be more correctly measured, is called corresponding position. To provide the opposing detector substrate at a position corresponding to the element substrate, the element substrate or the opposing detector substrate must be so moved that the distance becomes the shortest between the pixel and the opposing detector electrode.

In this case, the current flowing into the opposing detector substrate 102 can be measured by an ammeter 123 connected to the opposing detector substrate 102. That is, the current measured here is due to the video signal input to the selected pixel of the element substrate 103. Upon evaluating whether the measured current is lying within a predetermined range, it is allowed to inspect whether the wirings and the transistors possessed by the pixels are defective.

When a pixel is selected and a current flowing into the pixel electrode or into the electrically conducting film that serves as the pixel electrode lies outside the predetermined range, it can be regarded that the transistor possessed by the pixel is not normally working or the wiring is broken or is short-circuited. On the other hand, when a pixel is selected and a current flowing into the pixel electrode or into the electrically conducting film serving as the pixel electrode lies within the predetermined range, it can be regarded that the transistor and the wiring possessed by the pixel are normally working.

The range of current in which it can be regarded that the transistor and the wiring are normally working, can be suitably set by a person who conducts the inspection. When the number of the pixels in which the defects are occurring (defective pixels) is not smaller than n in the pixel portion as a result of inspection, it is regarded that the element substrate is defective. The number n of the defective pixels with which the device can be regarded to be defective, can be suitably set by the person who conducts the inspection.

An organic compound layer is formed on the electrode (pixel electrode) that has been formed on the element substrate inspected by the inspection method of the invention and in contact thereto, and an electrode (opposing electrode) is formed on the above organic compound layer in contact thereto to complete the light-emitting device. It is then made possible to distinguish whether the element substrate is acceptable or defective without the need of really effecting the display.

BRIEF DESCRIPTION OF THE DRAWINGS

FIGS. 4(A) to 4(C) are diagrams illustrating how to fabricate a light-emitting device;

FIGS. 5(A) to 5(C) are diagrams illustrating how to fabricate the light-emitting device;

FIGS. 6(A) and 6(B) are diagrams illustrating how to fabricate the light-emitting device;

DESCRIPTION OF THE PREFERRED EMBODIMENTS

The inspection device and the method of inspecting the element substrate by using the inspection device according to the invention will now be described with reference to FIG. 1. In this invention, the transistor used for the light-emitting device may be either a MOS transistor or a thin-film transistor (hereinafter referred to as TFT). In the case of the TFT, further, there is no need of imposing limitation on the structure, and there may be used a TFT of a structure such as of the planar type or of the inverse stagger type. Further, the drive circuit for the light-emitting device used in the invention may be a known one.

When the inspection method of the invention is used for the light-emitting device having an EL element, the element structure of the EL element and the EL material may comply with those of known ones.

In this specification, the inspection device refers to the one including the source 101 of electromagnetic waves and the opposing detector substrate 102 in combination. Here, however, the opposing detector substrate 102 shown is an example of the invention, and is in no way limited to the one of a shape shown in FIG. 1(A). The opposing detector substrates of other shapes will be described in detail in the working examples in the specification.

The source 101 of electromagnetic waves is connected to a power source 104. When a high voltage of several kilovolts is applied from the power source 104 to two pieces of electrodes in the source 101 of electromagnetic waves, the electrons generated by the cathode impinge upon the anode to generate electromagnetic waves. In this invention, it is desired to use an X-ray or a soft X-ray having a wavelength of from 0.01 to 100 nm. It is, however, also allowable to use electromagnetic waves that are capable of ionizing a gas existing between the opposing detector substrate and the element substrate, if such electromagnetic waves are available.

The electromagnetic waves, in general, exhibit a photoionization function. The principle is such that upon irradiating stable atoms and molecules with electromagnetic waves, electrons in the atoms and in the molecules are sprung out, and the atoms and molecules assume the positive (+) polarity since they are lacking electrons.

The electrons that are sprung out further attack other stable atoms and molecules to generate atoms or molecules having the negative (−) polarity.

Figure 1A:
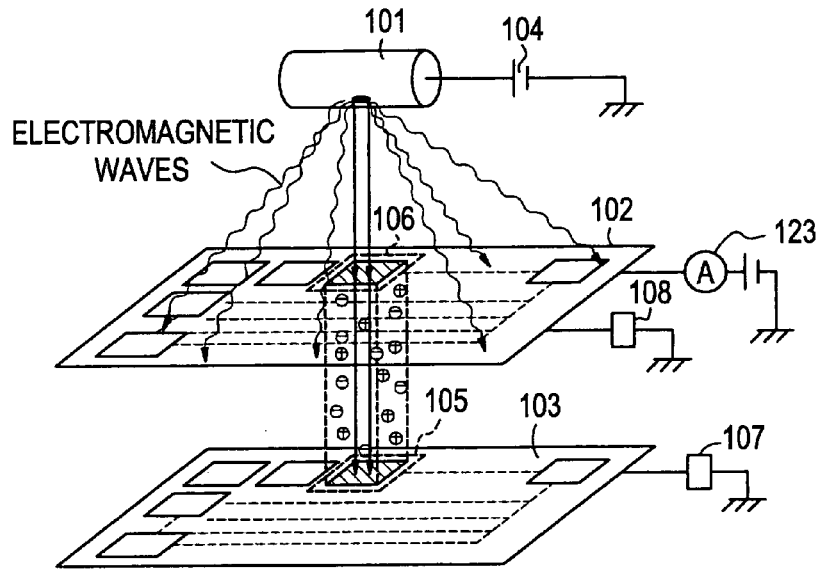
FIGS. 1A-C are diagrams illustrating an inspection device of this invention.

As a result, atoms and molecules that are ionized into the positive polarity and the negative polarity are present in the gas irradiated with electromagnetic waves. In this invention, therefore, the element substrate 103 and the opposing detector substrate 102 are overlapped as shown in FIG. 1(A) and are irradiated with electromagnetic waves from the source 101 of electromagnetic waves, so that the gas present between the element substrate 103 and the opposing detector substrate 102 is irradiated with the electromagnetic waves. At this moment, the gas (air) is ionized with electromagnetic waves, and an electric passage of ions can be formed between the element substrate 103 and the opposing detector substrate 102. The gas referred to here is the air. It is, however, also allowable to use a gas that is subject to be more ionized. It is further desired that the distance between the opposing detector substrate 102 and the element substrate 103 is as close as possible. Concretely speaking, it is desired that the distance between the opposing detector substrate 102 and the element substrate 103 is not larger than 500 μm.

On the element substrate 103 are formed plural pixels in the form of a matrix. Further, the element substrate 103 is connected to the drive circuit (A) 107. The drive circuit (A) 107 includes a drive circuit of the gate side and a drive circuit of the source side. As shown in FIG. 1(A), for example, a pixel 105 is selected when a selection signal is input to the pixel 105 from the drive circuit of the gate side. The selection signal referred to here stands for a signal that opens the gate electrode when a signal is input to the gate electrode connected to the gate line. A state where the gate electrode possessed by the pixel is opened by the selection signal is referred to as that the pixel is selected. When the pixel 105 is selected and a video signal is input thereto from the drive circuit of the source side, a current flows into the pixel electrode of the pixel 105 on the element substrate 103. The current further flows into opposing portions 106 formed on the opposing detector substrate 102 passing through the gas ionized by electromagnetic waves. In this specification, the opposing portions 106 are the ones formed like a matrix on the opposing detector substrate 102 being corresponded to the pixels 105 formed on the element substrate 103. On each opposing portion, there are formed an opposing detector electrode into which a current flows from the element substrate 103 and an inspection TFT 120 connected to the opposing detector electrode. In this specification, the inspection TFT 120 stands for a TFT which is capable of flowing a current from the selected pixel electrode on the element substrate 103 through the opposing detector electrode when the gate electrode is opened by a selection signal input from a drive circuit (B) 108 connected to the opposing detector substrate 102.

Figure 1B:
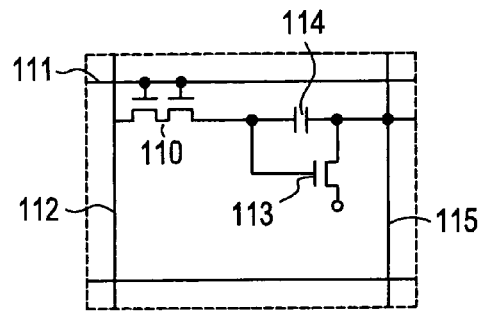

FIG. 1(B) is a diagram illustrating, on an enlarged scale, the pixels 105 formed like a matrix on the element substrate 103. Here, though the TFT is exemplified as a transistor, it is also allowable to use a MOS transistor. Referring to FIG. 1(B), the element substrate 103 for effecting the inspection includes a drive TFT formed on an insulator and TFTs (switching TFT and current control TFT) in the pixel portion.

In FIG. 1(B), reference numeral 110 denotes a switching TFT. The gate electrode of the switching TFT 110 is connected to a gate signal line 111. The source region and drain region of the switching TFT 110 are so connected that either one of them is connected to the source signal line 112 and the other one is connected to the gate electrode of the current control TFT 113 and to a capacitor 114 possessed by the pixels.

The capacitor 114 is for holding a gate voltage of the current control TFT 113 (potential difference between the gate electrode and the source region) when the switching TFT 110 has not been selected (off-state). Though the capacitor 114 is provided, here, the invention is in no way limited to the above constitution only, and the capacitor 114 may not be provided.

Further, the source region and drain region of the current control TFT 113 are so connected that either one of them is connected to a current feeder line 115 and the other one is connected to the pixel electrode possessed by the pixel 105. When an electric passage is formed by the irradiation with electromagnetic waves, the pixel electrode is connected to the source region of an inspection TFT (120 in FIG. 1(C)) possessed by the opposing portion 106 on the opposing detector substrate 102. The current feeder line 115 is connected to the capacitor 114.

Figure 1C:
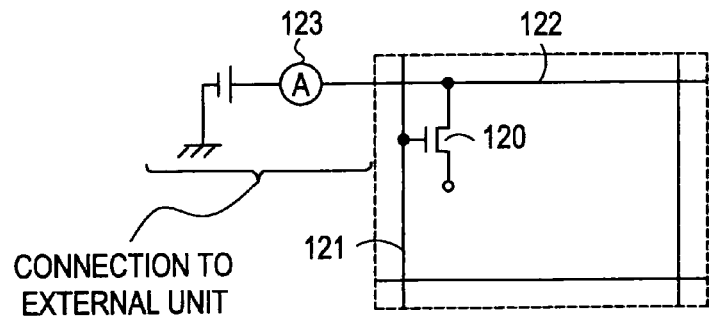

FIG. 1(C) is a diagram illustrating, on an enlarged scale, the opposing portions 106 formed like a matrix on the opposing detector substrate 102. An inspection TFT 120 is formed on each opposing portion, and the gate electrode is connected to a gate signal line 121 connected to the drive circuit (B) 108. When a pixel on the element substrate 103 is selected, an opposing portion 106 corresponding to the selected pixel on the substrate is selected by a selection signal from the drive circuit (B) 108. The drain region of the inspection TFT 120 is connected to a drain wiring 122 which is connected to an ammeter 123 on the external side.

The current feeder line 122 is served with a power source potential which is produced by a power source constituted by an external IC.

The switching TFT 110 and the current control TFT 113 may be either of the n-channel type or the p-channel type. When the source region or the drain region of the current control TFT 113 is connected to the anode of an EL element that is formed later, however, it is desired that the current control TFT 113 is of the p-channel type. When the source region or the drain region of the current control TFT 113 is connected to the cathode of the EL element, further, it is desired that the current control TFT 113 is of the n-channel type.

Further, the switching TFT 110 and the current control TFT 113 may be of a multi-gate structure such as the double-gate structure or the triple-gate structure in addition to the single-gate structure.

Figure 2A:
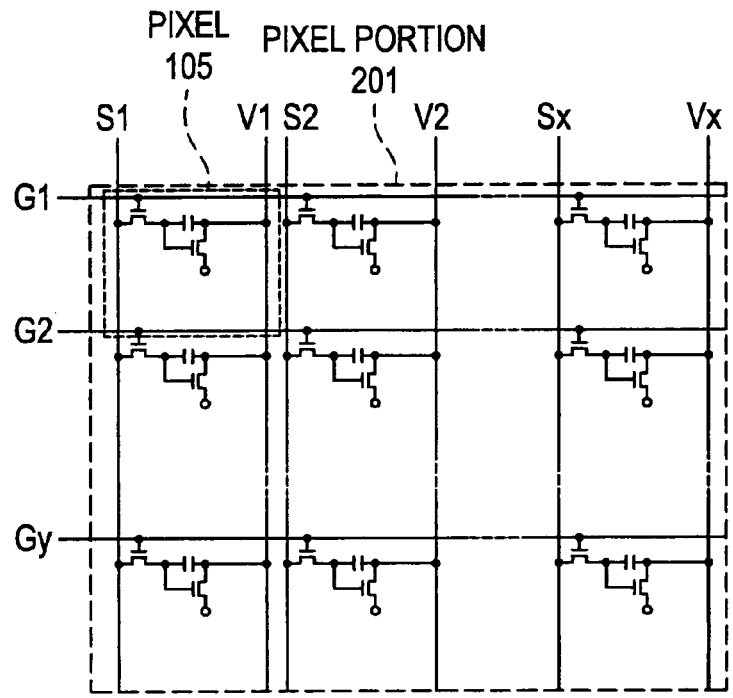
FIGS. 2A-B are diagrams illustrating a pixel structure of the element substrate and of the opposing detector substrate of this invention.
Figure 2B:
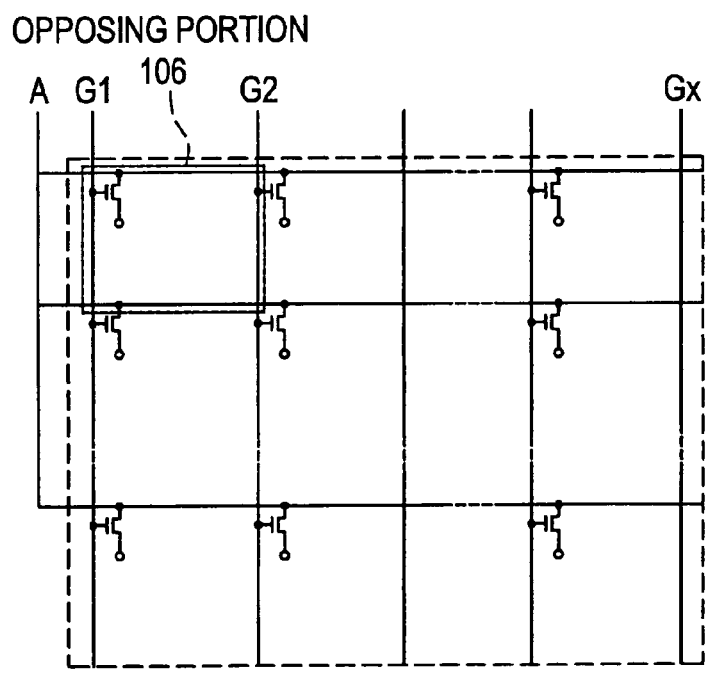

Next, FIGS. 2(A) and 2(B) illustrate the opposing detector substrate 102 of the invention and the element substrate 103 to be inspected thereby. A pixel portion 201 shown in FIG. 2(A) is the one on which the pixels 105 shown in FIG. 1(B) are formed like a matrix. The pixel portion 201 of FIG. 2(A) is provided with source signal lines (S1 to Sx), current feeder lines (V1 to Vx) and gate signal lines (G1 to Gy).

Here, the pixel 105 is a region including source signal line (S1 to Sx), current feeder line (V1 to Vx) and gate signal line (G1 to Gy) each in a number of one.

FIG. 2(B) illustrates the opposing portions 106 formed like a matrix on the opposing detector substrate 102 according to the invention. FIG. 2(B) shows gate signal lines (G1 to Gx). The opposing portions 106 are selected by signals from the gate signal lines (G1 to Gx). The drain region of the inspecting TFT 120 in each opposing portion 106 is connected to the current line (A) and is connected to an external ammeter 123.

That is, a current flows from a selected pixel on the element substrate 103 through an electric passage into a selected opposing portion 106 on the opposing detector substrate 102, and is detected by the ammeter 123. Either one or both of a stage securing the opposing detector substrate and a stage securing the element substrate may be provided with a positioning function, so that the distance becomes as small as possible between the pixel 105 on the element substrate 103 and the corresponding opposing portion 106 on the opposing detector substrate 102.

Next, described below with reference to FIG. 3 is a method of evaluating the switching TFTs 110 and current control TFTs 113 in the pixels 105 on the element substrate 103 by using the inspection method of the invention.

Figures 3A, 3B:
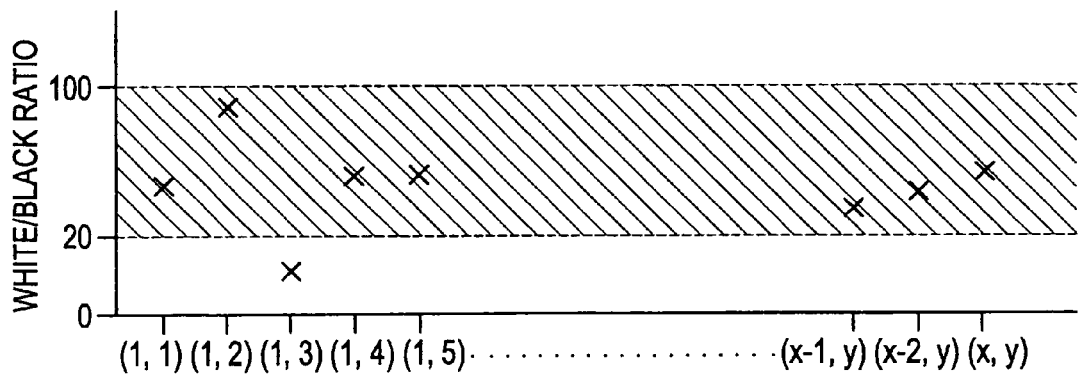
FIGS. 3(A) and 3(B) illustrate a method of evaluation relying upon the inspection according to this invention.

FIG. 3(A) shows the pixels formed in the pixel portion 201 on the element substrate 103 by way of X-Y coordinates (X, Y). Here, pixels of X columns are formed on the surface of the paper in the transverse direction, and pixels of Y rows are formed on the surface of the paper in the longitudinal direction.

When the gate electrode of the pixel is selected, a video signal is input to the selected pixel from the source signal line electrically connected to the source signal line drive circuit. At this moment, the current flows into the pixel electrode, input to the inspection TFT 120 from the opposing detector electrode of the opposing detector substrate 102 through the electric passage formed in the gas by the irradiation with electromagnetic waves and is, further, input to the ammeter 123 connected on the external side passing through the drain wiring. Here, the current flowing between the selected pixel on the element substrate 103 and the corresponding opposing portion is measured by the ammeter 123. It is further allowable to form the ammeter 123 on the opposing detector substrate 102.

In this embodiment, when the video signal contains "white" data irrespective of whether it may be in an analog form or in a digital form, the current control TFT 113 is turned on. Therefore, the power source potential is applied to the pixel electrode. As a result, a current flows from the pixel that has received the video signal containing "white" data to the opposing portion 106 on the opposing detector substrate 102 and to the ammeter 123.

Conversely, when the video signal contains "black" data, the current control TFT 113 formed on the element substrate 103 is turned off. Therefore, the power source potential is not applied to the pixel electrode. As a result, a current flows from the pixel that has received the video signal containing "black" data to the opposing portion 106 on the opposing detector substrate 102 and to the ammeter 123, the current being smaller than the current of when a video signal containing "white" data is input.

In the foregoing was described the case where both the switching TFT 110 and the current control TFT 113 are normally working. When either one of them is defective, however, it happens that a current that should flow fails to flow or a current that should not flow flows.

In this invention, therefore, a current of when the video signal is "black" and a current of when the video signal is "white" are measured in advance by using a pixel having a TFT that normally works to use them as reference data.

In this invention, further, the data are evaluated by using a ratio of currents (ratio of white and black) that flow when the video signals are white and black, respectively.

FIG. 3(B) illustrates the measured results represented by a ratio of standardized (normalized) white and black signals. In this standardization (normalization), 100 represents a sufficiently large ratio (contrast) of black and white by using the reference data. In this table, the ordinate represents the ratio of white and black, and the abscissa represents the coordinate of pixels. Further, a reference is set for the ratio of white and black, and the device is regarded to be acceptable when the ratio of white and black is not smaller than 20 but is not larger than 100. That is, the hatched region of FIG. 3(B) represents references of acceptable devices.

However, when the ratio of white and black is lower than the reference value like a coordinate (1, 3), the device is judged to be defective and is removed from the subsequent steps. The acceptable reference for the ratio of white and black may be set depending upon a level that is required.

Upon evaluating the characteristics of the pixels relying upon the above method, the defective products can be discovered at an early time. Accordingly, the defective products are removed from the subsequent production process such as formation of EL element. Depending upon the degree of defect, further, the device may be repaired through a step of repairing and may be returned back to the subsequent steps. Described below in detail in the following examples is a method of completing the light-emitting device by forming an organic compound layer and a cathode (second electrode) on the pixel electrode (first electrode) after the step of inspecting the element substrate has been finished.

This makes it possible to decrease the loss that results when the defective product is passed through up to the final step and to improve the yield owing to the repairing.

EXAMPLE 1

A method of manufacturing a pixel TFT and TFTs of a driver circuit (source signal line driver circuit, gate signal line driver circuit and pixel selective signal line driver circuit) provided in the periphery of a pixel portion is explained in this embodiment. For simplicity of the explanation, the CMOS circuit which is a basic unit concerning with the driver circuit is illustrated.

Figure 4A:
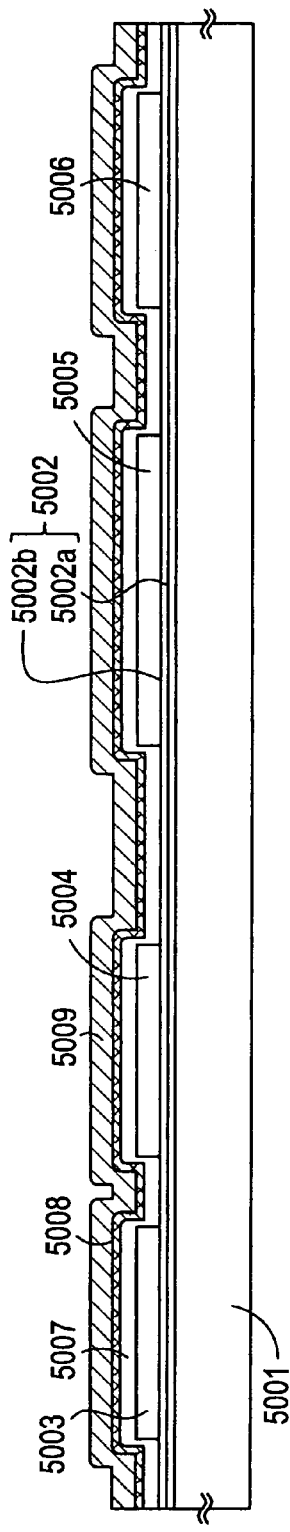

First, as shown in FIG. 4A, a base film 5002 made of an insulating film such as a silicon oxide film, a silicon nitride film, or a silicon oxynitride film is formed on a substrate 5001 made from glass, such as barium borosilicate glass or aluminum borosilicate glass, typically Corning Corp. #7059 glass or #1737 glass. For example, a silicon oxynitride film 5002a manufactured from $SiH_4$, $NH_3$, and $N_2O$ by plasma CVD is formed with a thickness of 10 to 200 nm (preferably from 50 to 100 nm), and a hydrogenized silicon oxynitride film 5002b with a thickness of 50 to 200 nm (preferably between 100 and 150 nm), manufactured from $SiH_4$ and $N_2O$, is similarly formed and laminated. The base film 5002 with the two layer structure is shown in Embodiment 1, but the base film 5002 may also be formed as a single film or as a lamination film in which two or more layers are laminated.

Island shape semiconductor layers 5003 to 5006 are formed of crystalline semiconductor film manufactured by using a laser crystalline method or a known thermal crystallization method with a semiconductor film having an amorphous structure. The thickness of the island shape semiconductor layers 5003 to 5006 is set from 25 to 80 nm (preferably between 30 and 60 nm). There are no limitations on the crystalline semiconductor film material, but it is preferable to form the film from a semiconductor material such as silicon or a silicon germanium (SiGe) alloy.

A laser such as a pulse oscillation type or continuous emission type excimer laser, a YAG laser, or a $YVO_4$ laser can be used as a laser light source in manufacturing the crystalline semiconductor film with the laser crystallization method. A method of condensing laser light emitted from a laser oscillator into a linear shape by an optical system and then irradiating the light to the semiconductor film may be employed when these types of lasers are used. The crystallization conditions may be suitably selected by the operator. However, the pulse oscillation frequency is set to 300 Hz, and the laser energy density is set from 100 to 400 $mJ/cm^2$ (typically between 200 and 300 $mJ/cm^2$) when using the excimer laser. Further, the second harmonic is utilized when using the YAG laser, the pulse oscillation frequency is set from 30 to 300 Hz, and the laser energy density may be set from 300 to 600 $mJ/cm^2$ (typically between 350 and 500 $mJ/cm^2$). The laser light which has been condensed into a linear shape with a width of 100 to 1000 mm, for example 400 mm, is then irradiated onto the entire surface of the substrate. This is performed with an overlap ratio of 50 to 90% for the linear laser light.

A gate insulating film 5007 is formed covering the island shape semiconductor layers 5003 to 5006. The gate insulating film 5007 is formed of an insulating film containing silicon having a thickness of 40 to 150 nm by plasma CVD or sputtering. A 120 nm thick silicon oxynitride film is formed in Embodiment 1. The gate insulating film is not limited to this type of silicon oxynitride film, of course, and other insulating films containing silicon may also be used, in a single layer or in a lamination structure. For example, when using a silicon oxide film, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHZ) electric power density of 0.5 to 0.8 $W/cm^2$. Good characteristics as a gate insulating film can be obtained by subsequently performing thermal annealing, at between 400 and 500° C., of the silicon oxide film thus manufactured.

A first conductive film 5008 and a second conductive film 5009 are then formed on the gate insulating film 5007 in order to form gate electrodes. The first conductive film 5008 is formed from Ta with a thickness of 50 to 100 μm, and the second conductive film 5009 is formed by W with a thickness of 100 to 300 nm, in Embodiment 1.

The Ta film is formed by sputtering, and sputtering with a Ta target is performed by using Ar. If appropriate amounts of Xe and Kr are added to the Ar during sputtering, the internal stress of the Ta film will be relaxed, and film peeling can be prevented. The resistivity of a phase Ta film is on the order of 20 μΩcm, and it can be used in the gate electrode, but the resistivity of β phase Ta film is on the order of 180 μΩcm and it is unsuitable for the gate electrode. The a phase Ta film can easily be obtained if a tantalum nitride film, which possesses a crystal structure near that of a phase Ta, is formed with a thickness of 10 to 50 nm as a base for Ta in order to form the a phase Ta film.

A W film is formed by sputtering with a W target. The W film can also be formed by thermal CVD using tungsten hexafluoride ($WF_6$). Whichever is used, it is necessary to make the film become low resistance in order to use it as the gate electrode, and it is preferable that the resistivity of the W film be made equal to or less than 20 μΩcm. The resistivity can be lowered by enlarging the crystals of the W film, but for cases in which there are many impurity elements such as oxygen within the W film, crystallization is inhibited, and the film becomes high resistance. A W target having a purity of 99.9999% is thus used in sputtering. In addition, the W film is formed while sufficient care is taken in order that no impurities From within the gas phase are introduced at the time of film formation. Thus, a resistivity of 9 to 20 μΩcm can be achieved.

Note that, although the first conductive film 5008 is Ta and the second conductive film 5009 is W in Embodiment 1, the conductive films are not limited to these. Both the first conductive film 5008 and the second conductive film 5009 may also be formed from an element selected from the group consisting of Ta, W, Ti, Mo, Al, and Cu, from an alloy material having one of these elements as its main constituent, or from a chemical compound of these elements. Further, a semiconductor film, typically a polysilicon film, into which an impurity element such as phosphorous is doped may also be used. Examples of preferable combinations other than that used in Embodiment 1 include: a combination of the first conductive film 5008 formed from tantalum nitride (TaN) and the second conductive film 5009 formed from W; a combination of the first conductive film formed from tantalum nitride (TaN) and the second conductive film 5009 formed from Al; and a combination of the first conductive film 5008 formed from tantalum nitride (TaN) and the second conductive film 5009 formed from Cu.

A mask 5010 is formed next from resist, and a first etching process is performed in order to form electrodes and wirings. An ICP (inductively coupled plasma) etching method is used in Embodiment 1. A gas mixture of $CF_4$ and $Cl_2$ is used as an etching gas, and a plasma is generated by applying a 500 W RF electric power (13.56 MHZ) to a coil shape electrode at 1 Pa. A 100 W RF electric power (13.56 MHZ) is also applied to the substrate side (test piece stage), effectively applying a negative self-bias. The W film and the Ta film are both etched on the same order when $CF_4$ and $Cl_2$ are combined.

Edge portions of the first conducting layer and the second conducting layer are made into a tapered shape in accordance with the effect of the bias voltage applied to the substrate side with the above etching conditions by using a suitable resist mask shape. The angle of the tapered portions is from 15 to 45°. The etching time may be increased by approximately 10 to 20% in order to perform etching without any residue remaining on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. First shape conductive layers 5011 to 5016 (first conductive layers 5011a to 5016a and second conductive layers 5011b to 5016b) composed of the first conducting layer and the second conducting layer are thus formed by the first etching process. Portions of the gate insulating film 5007 not covered by the first shape conductive layers 5011 to 5016 are etched on the order of 20 to 50 nm, forming thinner regions. (See FIG. 4A.)

Figure 4B:
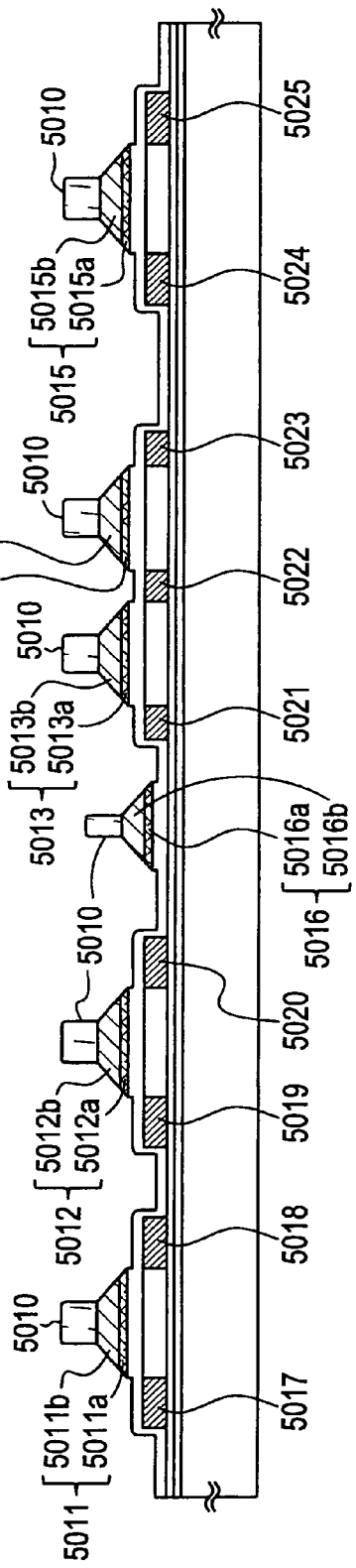

A first doping process is then performed, and an impurity element which imparts n-type conductivity is added. Ion doping or ion injection may be performed as the doping method. Ion doping is performed at conditions in which the dosage is set to $1\times10^{13}$ to $5\times10^{14}$ atoms/cm$^2$, and an acceleration voltage is set between 60 and 100 keV. An element residing in group 15 of the periodic table, typically phosphorous (P) or arsenic (As), is used as the n-type conductivity imparting impurity element. Phosphorous (P) is used here. The conductive layers 5011 to 5015 become masks with respect to the n-type conductivity imparting impurity element, and first impurity regions 5017 to 5025 are formed in a self-aligning manner. The impurity element which imparts n-type conductivity is added to the first impurity regions 5017 to 5025 at a concentration within a range of $1\times10^{20}$ and $1\times10^{21}$ atoms/cm$^3$. (See FIG. 4B.)

A second etching process is performed without removing resist mask next as shown in FIG. 4C. The W film is etched selectively using a mixture of $CF_4$, $Cl_2$, and $O_2$ is used as the etching gas. At that time, by the second etching process, second shape conductive layers 5026 to 5031 (first conductive layers 5026a to 5031a and second conductive layers 5026b to 5031b) are formed. The gate insulating film 5007 is additionally etched on the order of 20 to 50 nm, forming thinner regions, in regions not covered by the second shape conductive layers 5026 to 5031.

The etching reaction of the W film or the Ta film in accordance with the mixed gas of $CF_4$ and $Cl_2$ can be estimated from the generated radicals, or from the ion types and vapor pressures of the reaction products. Comparing the vapor pressures of W and Ta fluorides and chlorides, the W fluoride compound $WF_6$ is extremely high, and the vapor pressures of $WCl_5$, $TaF_5$, and $TaCl_5$ are of similar order. Therefore the W film and the Ta film are both etched by the $CF_4$ and $Cl_2$ gas mixture. However, if a suitable quantity of $O_2$ is added to this gas mixture, $CF_4$ and $O_2$ react, forming CO and F, and a large amount of F radicals or F ions are generated. As a result, the etching speed of the W film having a high fluoride vapor pressure becomes high. On the other hand, even if F increases, the etching speed of Ta does not relatively increase. Further, Ta is easily oxidized compared to W, and therefore the surface of Ta is oxidized by the addition of $O_2$. The etching speed of the Ta film is further reduced because Ta oxides do not react with fluorine and chlorine. It therefore becomes possible to have a difference in etching speeds of the W film and the Ta film, and it becomes possible to make the etching speed of the W film larger than that of the Ta film.

A second doping process is then performed as shown in FIG. 5A. In this case, an impurity element which imparts n-type conductivity is doped under conditions of a lower dosage than that in the first doping process, and at a higher acceleration voltage than that in the first doping process. For example, doping may be performed at an acceleration voltage of 70 to 120 keV and with a dosage of $1\times10^{13}$ atoms/cm$^2$, forming new impurity regions inside the first impurity regions formed in the island shape semiconductor layers of FIG. 4B. Doping is performed with the first shape conductive layers 5026 to 5030 as masks with respect to the impurity element, and doping is done such that the impurity element is also added to regions below the first conductive layers 5026a to 5030a. Third impurity regions 5032 to 5036 are formed. A concentration of phosphorus (P) added to the third impurity region 5032 to 5036 is provided with a gradual concentration gradient in accordance with a film thickness of the taper portion of the first conductive layer 5026a to 5030a. Further, in the semiconductor layer overlapping the taper portion of the first conductive layer 5026a to 5030a, from an end portion of the taper portion of the first conductive layer 5026a to 5030a toward an inner side, the impurity concentration is more or less reduced, however, the concentration stays to be substantially the same degree.

As shown in FIG. 5B, a third etching process is performed. This is performed by using a reactive ion etching method (RIE method) with an etching gas of $CHF_6$. The tapered portions of the first conductive layers 5026a to 5031a are partially etched, and the region in which the first conductive layers overlap with the semiconductor layer is reduced by the third etching process. Third shape conductive layers 5037 to 5042 (first conductive layers 5037a to 5042a and second conductive layers 5037b to 5042b) are formed. At this point, regions of the gate insulating film 5007, which are not covered with the third shape conductive layers 5037 to 5042 are made thinner by about 20 to 50 nm by etching.

By the third etching process, third impurity regions 5032a to 5036a, which overlap with the first conductive layers 5037a to 5041a, and second impurity regions 5032b to 5236b between the first impurity regions and the third impurity regions are formed in the third impurity regions.

Figure 5C:
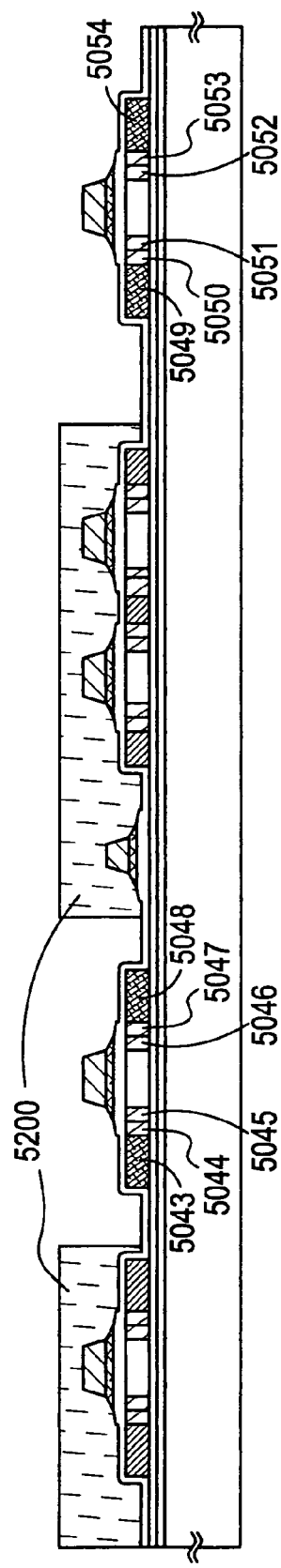

Then, as shown in FIG. 5C, the third doping process is performed to form the fourth impurity regions 5043 to 5054, which have a conductivity type opposite to the first conductivity type, in the island-like semiconductor layers 5004, 5006 forming p-channel TFTs. The third conductive layers 5038b to 5041b are used as masks to an impurity element, and the impurity regions are formed in a self-aligning manner. At this time, the whole surfaces of the island-like semiconductor layers 5003, 5005 and the wiring portion 5042, which form n-channel TFTs are covered with a resist mask 5200. Phosphorus is added to the impurity regions 5043 to 5054 at different concentrations, respectively. The regions are formed by an ion doping method using diborane ($B_2H_6$) and the impurity concentration is made $2 \times 10^{20}$ to $2 \times 10^{21}$ atoms/cm$^3$ in any of the regions.

By the steps up to this, the impurity regions are formed in the respective island-like semiconductor layers. The third shape conductive layers 5043 to 5054 overlapping with the island-like semiconductor layers function as gate electrodes. The conductive layer 5042 functions as an island-like source signal line.

After the resist mask 5200 is removed, a step of activating the impurity elements added in the respective island-like semiconductor layers for the purpose of controlling the conductivity type is conducted. This step is carried out by a thermal annealing method using a furnace annealing oven. In addition, a laser annealing method or a rapid thermal annealing method (RTA method) can be applied. The thermal annealing method is performed in a nitrogen atmosphere having an oxygen concentration of 1 ppm or less, preferably 0.1 ppm or less and at 400 to 700° C., typically 500 to 600° C. In Embodiment 1, a heat treatment is conducted at 500° C. for 4 hours. However, in the case where a wiring material used for the third conductive layers 5037 to 5042 is weak to heat, it is preferable that the activation is performed after an interlayer insulating film (containing silicon as its main ingredient) is formed to protect the wiring line or the like.

Further, a heat treatment at 300 to 450° C, for 1 to 12 hours is conducted in an atmosphere containing hydrogen of 3 to 100%, and a step of hydrogenating the island-like semiconductor layers is conducted. This step is a step of terminating dangling bonds in the semiconductor layer by thermally excited hydrogen. As another means for hydrogenation, plasma hydrogenation (using hydrogen excited by plasma) may be carried out.

Next, as shown in FIG. 6A, a first interlayer insulating film 5055 made of an inorganic insulator material is formed. In this embodiment, a first interlayer insulating film 5055 made of a silicon nitride film having a thickness of 100 to 200 nm is formed. A second interlayer insulating film 5056 made of an organic insulator material formed thereon. Contact holes are then formed with respect to the first interlayer insulating film 5055, the second interlayer insulating film 5056, and the gate insulating film 5007, respective wirings (including connection wirings and signal lines) 5057 to 5062, and 5064 are formed by patterning, and then, a pixel electrode 5063 that contacts with the connection wiring 5062 is formed by patterning.

Next, the film made from organic resin is used for the second interlayer insulating film 5056. As the organic resin, polyimide, polyamide, acryl, BCB (benzocyclobutene)or the like can be used. Especially, since the second interlayer insulating film 5056 has rather the meaning of flattening, acryl excellent in flatness is desirable. In Embodiment 1, an acryl film is formed to such a thickness that stepped portions formed by the TFTs can be adequately flattened. The thickness is preferably made 1 to 5 µm (more preferably 2 to 4 µm).

In the formation of the contact holes, dry etching or wet etching is used, and contact holes reaching the n-type impurity regions 5017, 5018, 5021 and 5023 or the p-type impurity regions 5043 to 5054, a contact hole reaching the wiring 5042, a contact hole reaching the power source supply line (not shown), and contact holes reaching the gate electrodes (not shown) are formed, respectively.

Further, a lamination film of a three layer structure, in which a 100 nm thick Ti film, a 300 nm thick aluminum film containing Ti, and a 150 nm thick Ti film are formed in succession by sputtering, is patterned into a desirable shape, and the resultant lamination film is used as the wirings (including connection wirings and signal lines) 5057 to 5062, and 5064. Of course, other conductive films may be used.

In this example, further, an ITO film is formedmaintaining a thickness of 110 [nm] as a pixel electrode 5063 and is patterned. The pixel electrode 5063 is overlapped on the connection wiring 5062 in contact therewith. It is also allowable to use a transparent electrically conducting film by mixing 2 to 20[%] of zinc oxide (ZnO) into indium oxide. The pixel electrode 5063 serves as an anode of the EL element (FIG. 6(A)). When the area of the wiring region increases relative to the area of the pixel electrode, error increases due to a relation of detection. It is therefore desired that the ratio of pixel area is large. Besides, the display element requires a high numerical aperture, and the requirements of the two are in agreement.

Figure 7A:
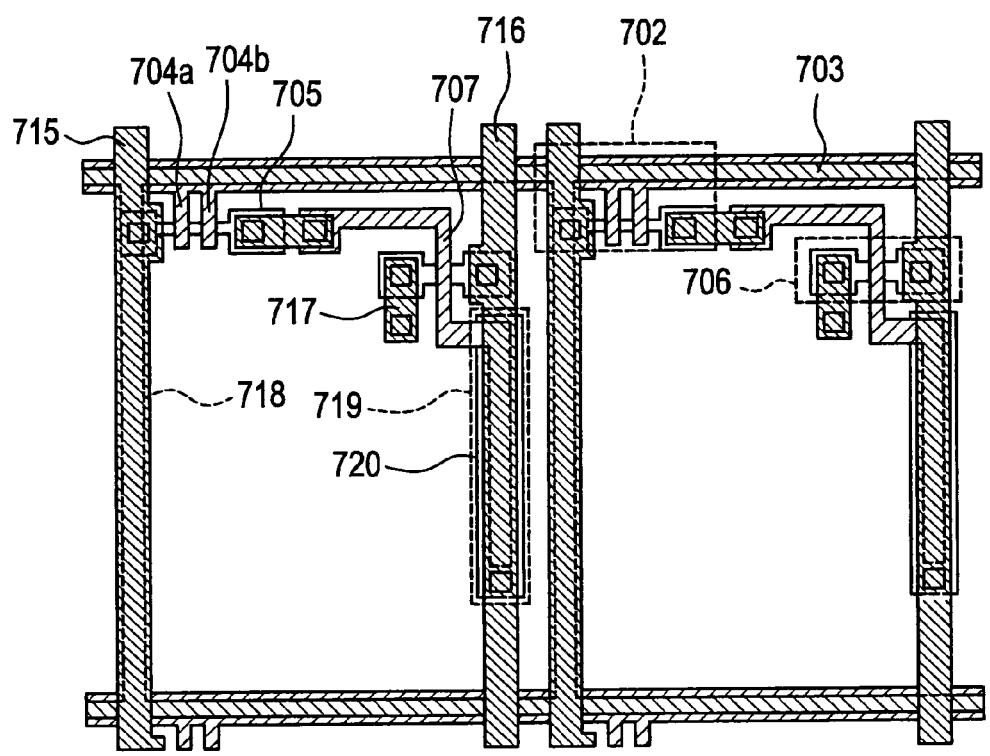
FIG. 7(A) is a top view of an element substrate inspected according to this invention.
Figure 7B:
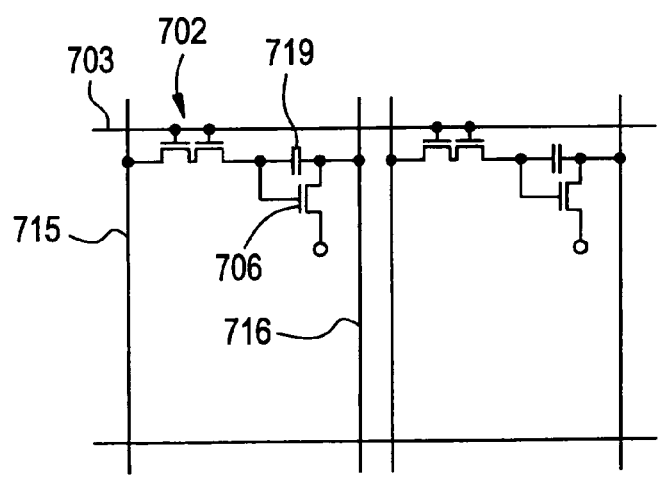
FIG. 7(B) is a circuit diagram of the element substrate according to this invention.

After formed up to this point, the element substrate is inspected by using the inspection method and the inspection device of the invention as described in the Example of the invention. FIG. 7(A) is a top view and FIG. 7(B) is a circuit diagram of the pixel portion of the light-emitting device formed up to this point according to the Example. Common reference numerals are used in FIGS. 7(A) and 7(B).

The source of a switching TFT 702 is connected to a source wiring 715, and the drain region is connected to a drain wiring 705. The drain wiring 705 is electrically connected to a gate electrode 707 of a current control TFT 706. Further, the source of the current control TFT 706 is electrically connected to a current feeder line 716, and the drain region is electrically connected to a drain wiring 717. The drain wiring 717 is further electrically connected to a pixel electrode (anode) 718 indicated by a dotted line.

Here, a holding capacity is formed in a region designated at 719. The holding capacity 719 is formed among a semiconductor film 720 electrically connected to the current feeder line 716, an insulating film (not shown) of the same layer as the gate-insulating film and the gate electrode 707. It is also possible to use, as a holding capacity, the capacity formed by the gate electrode 707, a layer (not shown) same as the first interlayer-insulating film and the current feeder line 716.

Figure 8A:
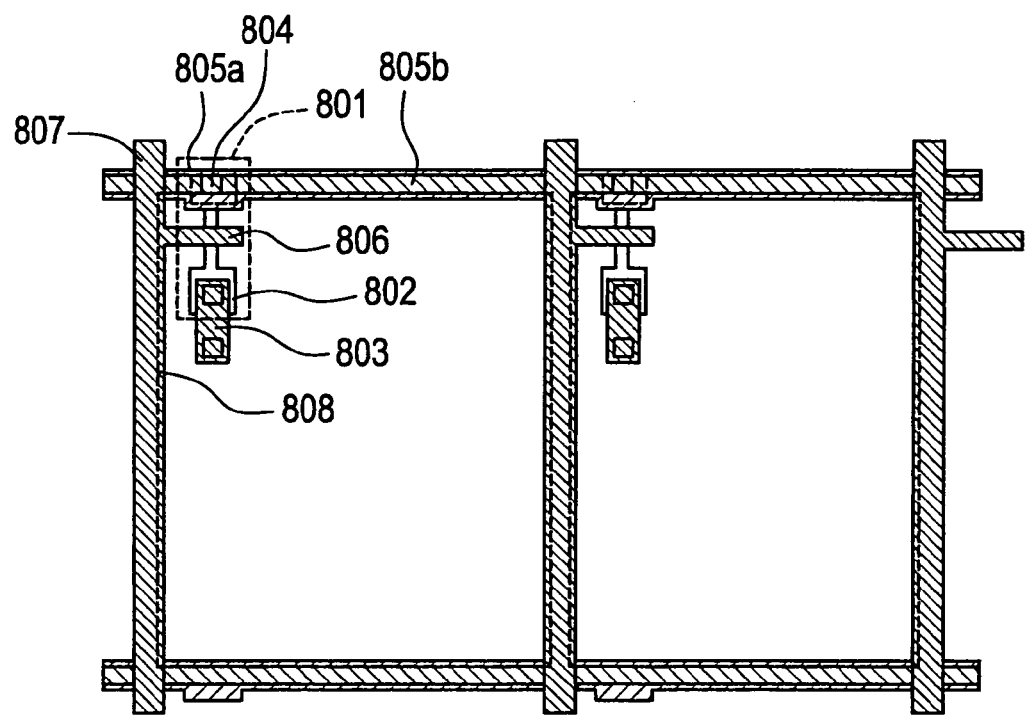
FIG. 8(A) is a top view of the opposing detector substrate used for the invention.
Figure 8B:
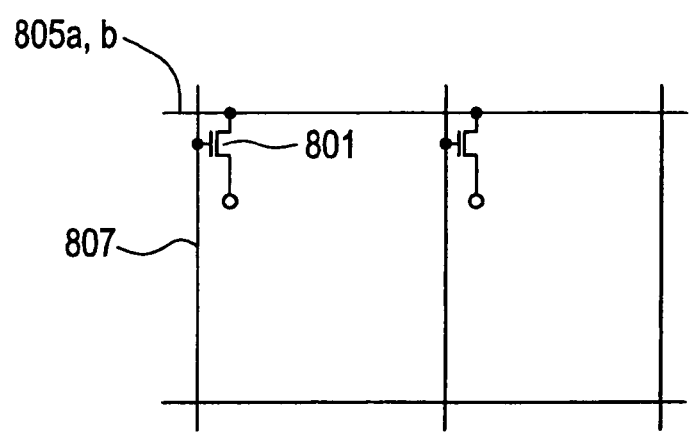
FIG. 8(B) is a circuit diagram of the element substrate according to this invention.

FIG. 8 is a top view of the opposing detector substrate used in the Example. The opposing detector substrate in this Example may use a glass or quartz as a material that permits electromagnetic waves to easily pass through. Further, this Example uses a soft X-ray of electromagnetic waves of wavelengths of from 0.1 to 100 nm. The opposing detector substrate can be fabricated by using the same method as the one for fabricating the element substrate described in Example. Here, however, the opposing detector electrode formed on the opposing detector substrate is formed of beryllium or aluminum which is different from the material forming the pixel electrodes of the element substrate, and should permit soft X-rays to easily pass through. These materials may be formed on the whole surface of the opposing portions, or may be formed like stripes or like a mesh.

When the opposing detector substrate is formed by another low-temperature film-forming process, there can be used an organic resin such as vinyl chloride or acrylic resin in addition to glass and quartz.

Reference numeral 801 denotes an inspection TFT. The source region 802 of the inspection TFT 801 is connected to the opposing detector electrode through a source wiring 803, and is electrically connected to the pixel electrode of the element substrate when the gas in the air is irradiated with the soft X-rays to form an electric passage. Further, the drain region 804 of the inspection TFT 801 is connected to the drain wirings (805a and 805b), and is electrically connected to an ammeter (not shown) provided on the outer side.

The gas is ionized upon being irradiated with the soft X-rays. In this invention, the ionization stands for the one that is ionized to such an extent that a current flows from the pixel electrode to the opposing detector electrode through the ionized gas.

The gate electrode 806 is connected to the gate line 807, and the opposing detector electrode is a region indicated by a dotted line 808.

Figure 9:
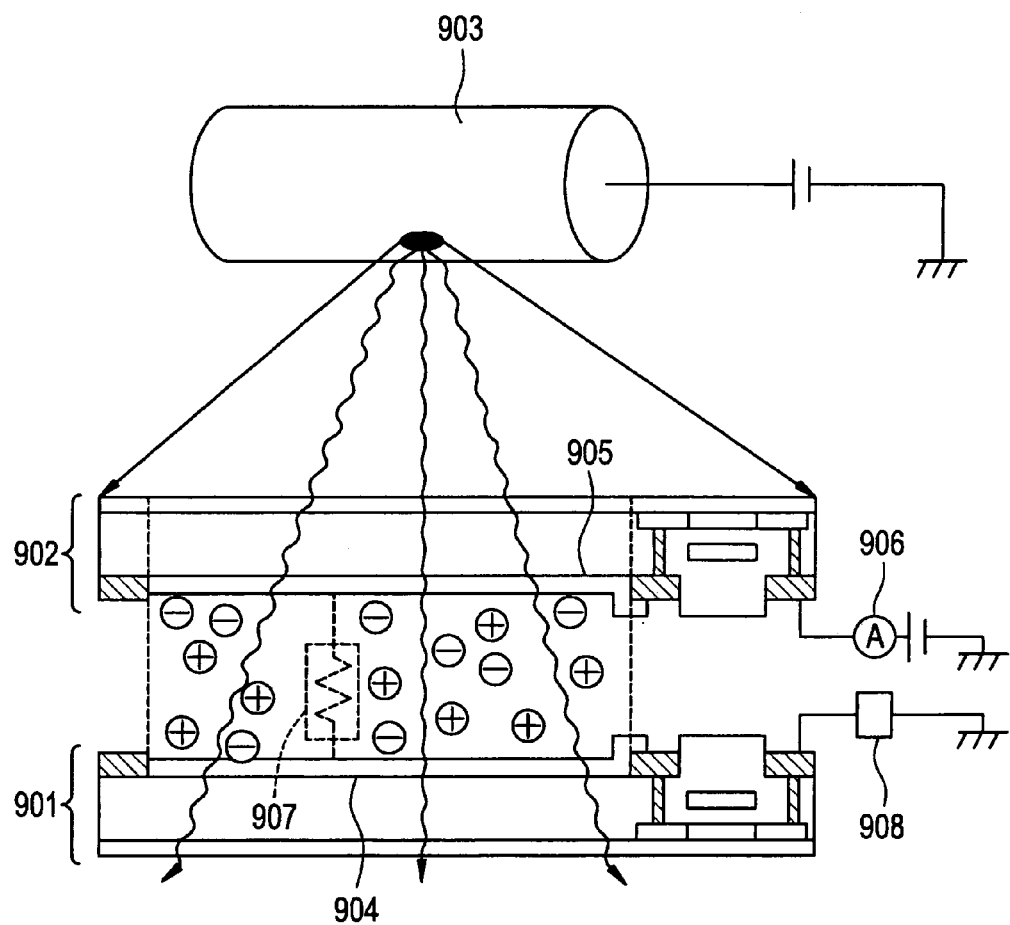
FIG. 9 is a diagram illustrating the inspection method of this invention.

The element substrate having the pixel electrode is formed and is, then, inspected in a manner as described below. First, the element substrate 901 and the opposing detector substrate 902 are arranged up and down as shown in FIG. 9 to carry out the inspection. In this embodiment, the element substrate 901 and the opposing detector substrate 902 are arranged in a manner as shown in FIG. 9, and the electromagnetic waves are radiated from the upper side of the opposing detector substrate to ionize the air. The invention, however, is in no way limited thereto only but may be such that the air is ionized to form an electric passage to flow an electric current between the element substrate 901 and the opposing detector substrate 902.

When the opposing detector substrate 902 is irradiated with the soft X-rays from the source 903 of electromagnetic waves, the soft X-rays pass through the opposing detector substrate 902, and the air between the opposing detector substrate 902 and the element substrate 901 is irradiated with the soft X-rays. In FIG. 9, the air is ionized-by the soft X-rays, and there is formed an apparent resistance as designated at 907.

Thus, an electric passage is formed in the air. When a video signal is input to the selected pixel on the element substrate 901, therefore, a current flowing into the pixel electrode 904 also flows into the opposing detector electrode 905 on the opposing detector substrate 902 passing through the electric passage.

The current, then, flows into an external ammeter 906 through the drain wiring from the source region of the inspecting TFT connected to the opposing detector electrode 905 via the drain region. Currents flowing into the pixel electrode are detected by the external ammeter at the time when the video signal is input (white) to the pixel on the element substrate 901 and when no video signal is input thereto (black), and are expressed as a ratio of white and black to evaluate the quality of TFT on the element substrate 901. The process for forming the EL element is conducted while removing those devices of qualities lower than a reference value. Depending upon the cause of defect and the degree of defect, further, the devices may be repaired through a repairing step and may be returned back to the subsequent steps.

Referring next to FIG. 6(B), the insulating film containing silicon (silicon oxide film in this embodiment) is formed maintaining a thickness of 500 [nm], an opening is formed at a position corresponding to the pixel electrode 5063, and a third interlayer-insulating film 5065 is formed to serve as a bank. The opening is formed by the wet etching method thereby to easily form the tapered side walls. Attention must be given to that unless the side walls of the opening portion are formed sufficiently mildly, the EL layer is deteriorated to a conspicuous degree due to a step.

Next, the EL layer 5066 and the cathode (MgAg electrode) 5067 are continuously formed by the vacuum evaporation method without being exposed to the open air. Here, the EL layer 5066 should have a thickness of 80 to 200 [nm](typically, 100 to 120 [nm]) and the cathode 5067 should have a thickness of 180 to 300 [nm](typically, 200 to 250 [nm]).

At this step, there are successively formed the EL layer 5066 and the cathode 5067 for the pixel corresponding to red color, for the pixel corresponding to green color and for the pixel corresponding to blue color. Here, however, the EL layer 5066 has a poor resistance against the solution and must be separately formed for each of the colors without relying upon the photolithography technology. It is therefore desired to employ a method such as evaporation method of selectively forming the EL layer 5066 and the cathode 5067 on the required portions only while concealing the areas except the desired pixels by using a metal mask.

First, a mask is set to conceal all areas except the pixels corresponding to red color, and the EL layer 5066 that emits red light is selectively formed by using the mask. Next, a mask is set to conceal all areas except the pixels corresponding to green color, and the EL layer that emits green light is selectively formed by using the mask. Then, a mask is set to conceal all areas except the pixels corresponding to blue color, and the EL layer that emits blue light is selectively formed by using the mask. Though different masks were used above, it is also allowable to use the same mask.

Though in the foregoing was used the system for forming EL elements of three kinds corresponding to RGB, there may be used a system combining a white light-emitting EL element and a color filter, a system combining a blue light-emitting or green light-emitting EL element and a fluorescent material (fluorescent color conversion layer: CCM) or a system using a transparent electrode as the cathode (opposing electrode) and overlapping thereon EL elements corresponding to RGB.

Known materials can be used for forming the EL layer 5066. As the known material, there can be preferably used an organic material by taking the drive voltage-into consideration. For example, f our layers comprising a positive hole-injection layer, a positive hole-transporting layer, a light-emitting layer and an electron injection layer may be used as the EL layer.

Next, an opposing electrode 5067 is formed by using a metal mask on the pixels (pixels of the same line) having switching TFTs of which the gate electrodes are connected to the same gate signal line. Though MgAg which is a cathode material was used for the opposing electrode 5067 in this Example, it should be noted that the invention is not limited thereto only, but any other known material may be used as the opposing electrode 5067.

Finally, a passivation film 5068 which is a silicon nitride film is formed maintaining a thickness of 300 [nm]. Upon forming the passivation film 5068, the EL layer 5066 is protected from the moisture so as to exhibit further improved reliability of EL elements.

Thus, the light-emitting device of a structure shown in FIG. 6(B) is completed. In the step of forming the light-emitting device according to this Example, the source signal lines are formed by using Ta and W which are the materials forming the gate electrodes and the gate signal lines are formed by using Al which is a wiring material forming the drain electrodes due to the circuit constitution and the steps. It is, however, allowable to use different materials, too.

Upon arranging TFTs of an optimum structure not only in the pixel portion but also in the drive circuit portion, the light-emitting device of this Example exhibits a very high reliability and improved operation characteristics. In the step of crystallization, further, it is also allowable to add a metal catalyst such as Ni to enhance the crystallinity. This enables the source signal line drive circuit to operate at a drive frequency of not lower than 10 [MHz].

First, in order to prevent the drop in the operation speed as much as possible, the TFT of a structure which suppresses the injection of hot carriers is used as the n-channel TFT for the CMOS circuit that forms the drive circuit portion. The drive circuit referred to here includes shift registers, buffers, and level shifters, and includes latches in the line sequential drive and includes transmission gates in the point sequential drive.

In the case of this Example, the active layer of the n-channel TFT includes the source region, drain region, overlapped LDD region ($L_{OV}$ region) overlapped on the gate electrode with the gate-insulating film sandwiched therebetween, an offset LDD region ($L_{OFF}$ region) which is not overlapped on the gate electrode with the gate-insulating film sandwiched therebetween, and channel-forming region.

The p-channel TFT of the CMOS circuit needs not be particularly provided with the LDD region since it is not almost deteriorated by the injection of hot carriers. It is, of course, allowable to provide the LDD region like the N-channel TFT to cope with the hot carriers.

Further, when the drive circuit employs the CMOS circuit in which the current flows in both directions through the channel-forming region, i.e., employs the CMOS circuit in which the roles of the source region and of the drain region are replaced by each other, it is desired that the n-channel TFT forming the CMOS circuit forms the LDD regions on both sides of the channel-forming region in such a manner that the LDD regions sandwich the channel-forming region. Such an example can be represented by a transmission gate used for the point sequential drive. Further, when the drive circuit employs the CMOS circuit which must suppress the off current as small as possible, it is desired that the n-channel TFT forming the CMOS circuit has the $L_{OV}$ region. This can also be exemplified by the transmission gate used for the point sequential drive.

In practice, further, when the device is completed up to the state of FIG. 6(B), it is desired to package (seal) the device with a protection film (laminate film, etc.) having high air-tightness permitting the gas to escape little or with a light-transmitting sealing member so that the device will not be exposed to the open air. In this case, the interior of the sealing member may be filled with an inert atmosphere or a hygroscopic material (e.g., barium oxide) may be arranged therein to improve the reliability of the EL element.

After the air-tightness is enhanced by the treatment such as packaging, the device is completed as the product by attaching a connector (flexible printed circuit: FPC) for connecting the element formed on the substrate or for connecting the terminals drawn from the circuit to the external signal terminals. The device in a state that can be shipped is called light-emitting device in this specification.

EXAMPLE 2

Figure 10:
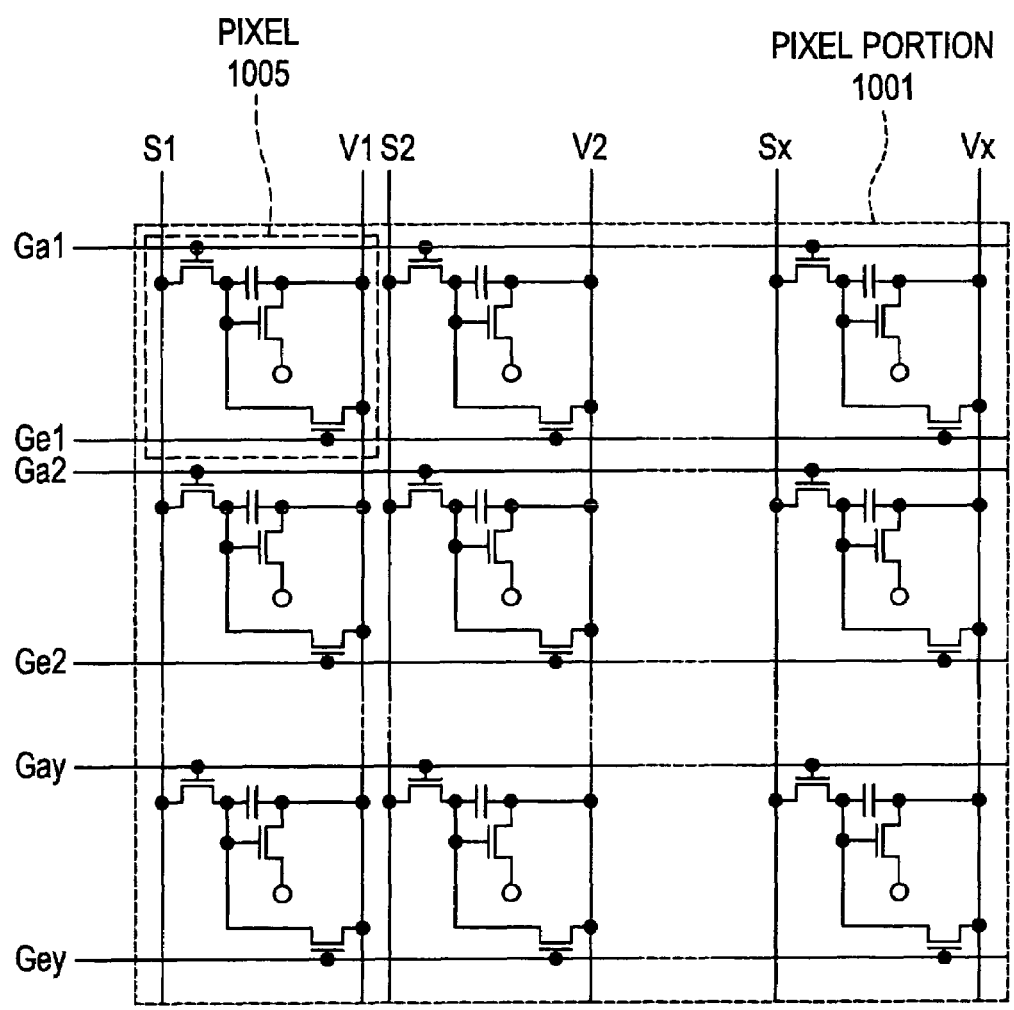
FIG. 10 is a circuit diagram of pixels in the light-emitting device.

Next, described below with reference to FIG. 10 is the structure of the pixel portion of the element substrate for conducting the inspection according to the invention, which is different from the structure of Example 1.

A pixel portion 1001 includes source signal lines (S1 to Sx) connected to the source signal line drive circuit, current feeder lines (V1 to Vx) connected to an external power source of the light-emitting device via the FPC, gate signal lines (first gate signal lines)(Ga1 to Gay) for writing connected to the write gate signal line drive circuit, and gate signal lines (second gate signal lines)(Ge1 to Gey) for erasing connected to the erase gate signal line drive circuit.

A pixel 1005 is formed by a region that includes source signal lines (S1 to Sx), current feeder lines (V1 to Vx), write gate signal lines (Ga1 to Gay) and erase gate signal lines (Ge1 to Gey). In the pixel portion 1001 are arranged plural pixels 1005 like a matrix. The element substrate of this Example can be put into practice in combination with the constitution of Example 1.

EXAMPLE 3

Figure 11:
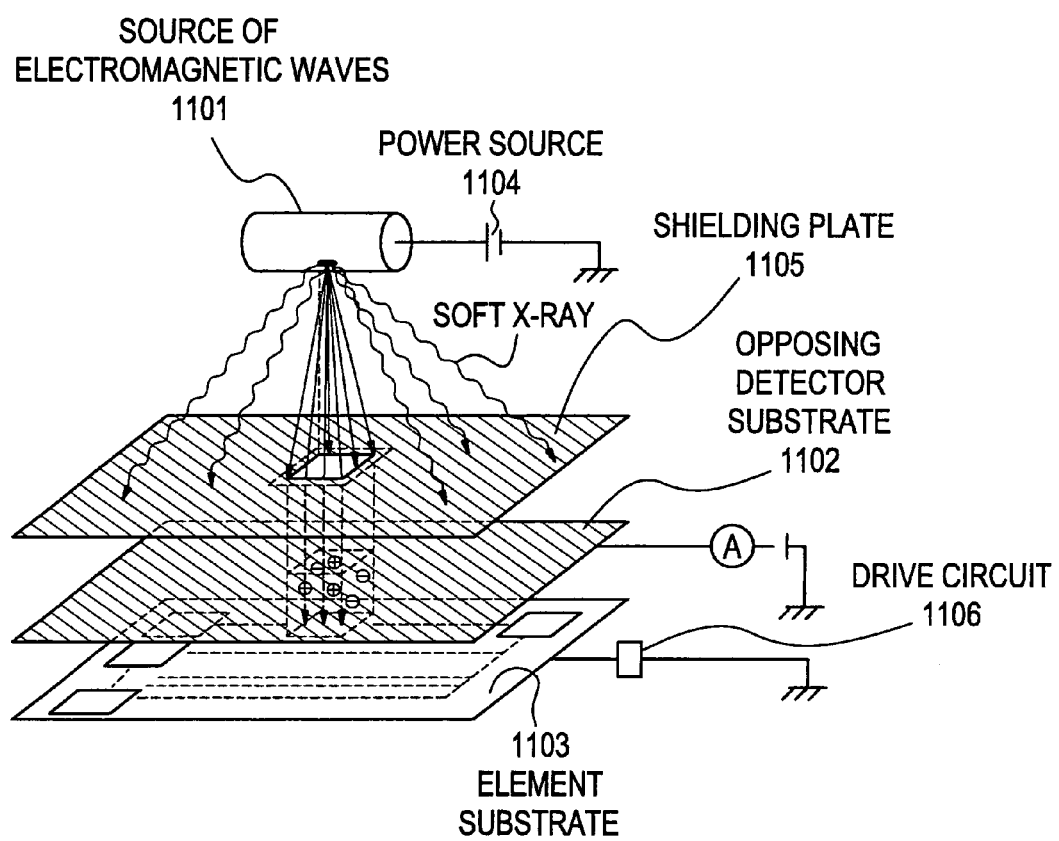
FIG. 11 is a diagram illustrating the constitution of the opposing detector substrate of this invention.

Described below with reference to FIG. 11 is a method of inspection by using an opposing detector substrate different from the one dealt with in Example 1 for conducting the inspection according to the invention.

In FIG. 11, reference numeral 1101 is a source of electromagnetic waves for generating soft X-rays having wavelengths of 0.1 to 100 nm among the electromagnetic waves, and a power source 1104 is connected to the source 1101 of electromagnetic waves.

The soft X-rays emitted from the source 1101 of electromagnetic waves fall on the opposing detector substrate 1102 passing through a fine hole of a shielding plate 1105 corresponding to the object surface. Other portions are shielded by the shielding plate 1105. The shielding plate 1105 is made of a material capable of shielding the soft X-rays to a sufficient degree. The soft X-rays pass through the opposing detector substrate 1102 and fall on the air between the opposing detector substrate 1102 and the element substrate 1103. Unlike the opposing detector substrate 1102 on which the inspection TFT and the opposing detector electrode are formed for each of the opposing-portions formed like a matrix used in Example 1, the opposing detector substrate 1102 used in this Example has an electrically conducting film such as of a metal formed on the insulator so that the whole surface works as the opposing detector electrode. The electrically conducting film needs not be formed on the whole surface but may be formed in the form of stripes or a mesh.

The opposing detector substrate 1102 can be placed on the element substrate 1103 to conduct the inspection.

As the conductor for forming the opposing detector electrode, there can be used a metal material which permits the soft X-rays to pass through highly efficiently, such as beryllium or aluminum. The shielding plate 1105 may be the one that shields the soft X-rays. For example, there may be used a material which permits the soft X-rays to pass through little, such as lead glass having a hole perforated in a portion through where the soft X-rays are to be passed for irradiation.

In this Example, the opposing detector substrate 1102 and the element substrate 1103 positioned under the source 1101 of electromagnetic waves and shielding plate 1105, are shifted together to irradiate the air present between the opposing detector substrate 1102 and the element substrate 1103 with the soft X-rays. That is, the element substrate 1103 is interlocked to the opposing detector substrate 1102.

As the air present between the opposing detector substrate 1102 and the element substrate 1103 is irradiated with the soft X-rays that have passed through the opposing detector substrate 1102, an electric passage is formed between the opposing detector substrate 1102 and the element substrate 1103, making it possible to measure the current that flows from the pixel electrode possessed by the pixel formed on the element substrate 1103 to the opposing detector electrode formed on the opposing detector substrate 1102.

Though in the foregoing was described the constitution for inspecting the element substrate by interlocking the opposing detector substrate 1102 and the element substrate 1103 together, it is also allowable to fix them and move the source of electromagnetic waves only.

The measuring method and the evaluation method may comply with those of Example 1. The constitution of this embodiment can be executed upon combining the constitutions of Examples 1 and 2.

EXAMPLE 4

Figure 12:
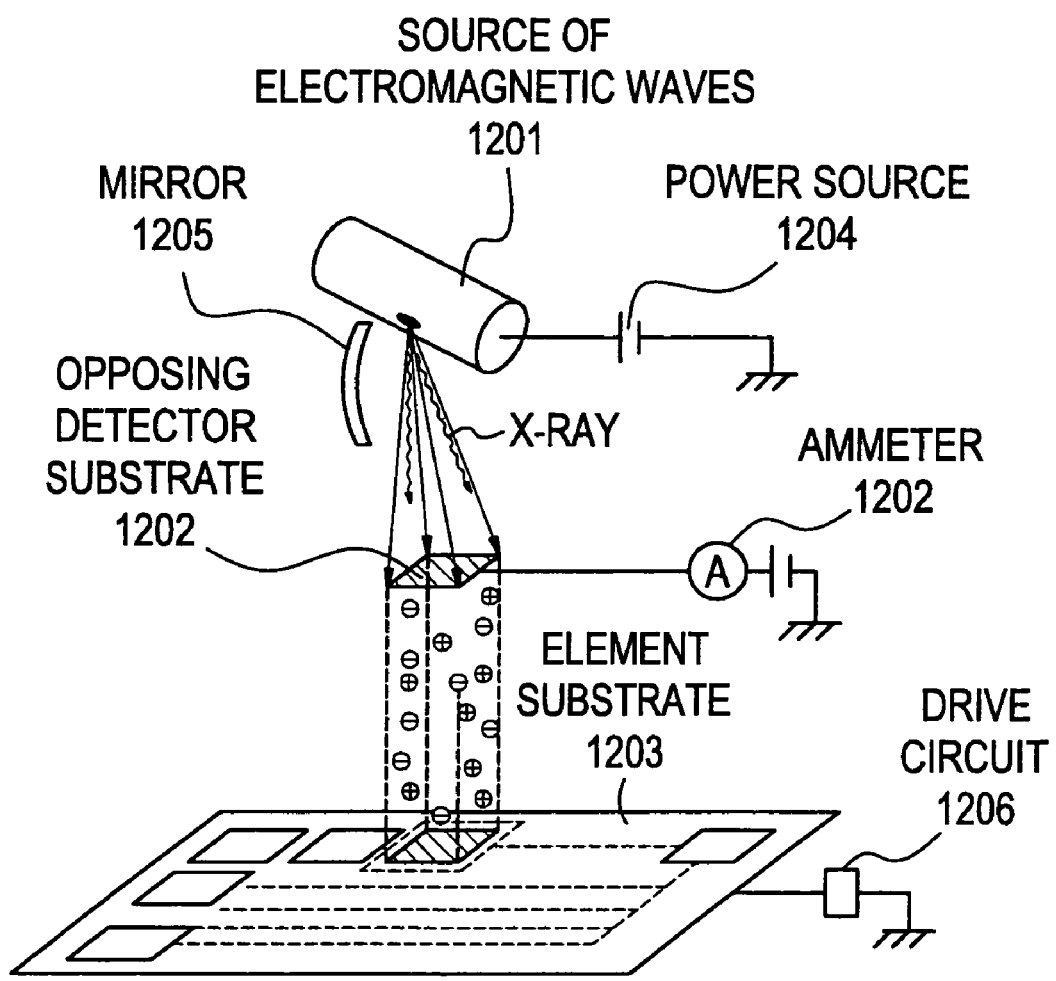
FIG. 12 is a diagram illustrating the constitution of the opposing detector substrate of this invention.

Described below with reference to FIG. 12 is a method of inspection by using an opposing detector substrate different from those dealt with in Examples 1 and 3 in conducting the inspection according to the invention.

In FIG. 12, reference numeral 1201 denotes a source of electromagnetic waves for generating X-rays having wavelengths of 0.01 to 100 nm among the electromagnetic waves, and a power source 1204 is connected to the source 1201 of electromagnetic waves.

The X-rays emitted from the source 1201 of electromagnetic waves are focused on the opposing detector substrate 1202 and falls on the element substrate 1203 passing through the opposing detector substrate 1202. Here, the material used for the opposing detector electrode formed on the opposing detector substrate 1202 may be beryllium or aluminum that permits X-rays to pass through highly efficiently.

In this Example, the element substrate 1203 is provided under the source 1201 of electromagnetic waves and the opposing detector substrate 1202, and is moved every time when each of the pixels of the element substrate 1203 is inspected. The mirror 1205 works to focus the X-rays. That is, in this Example, the source 1201 of electromagnetic waves and the opposing detector substrate 1202 are fixed, and the element substrate 1203 is moved every time when a different pixel is inspected.

As the air present between the opposing detector substrate 1202 and the element substrate 1203 is irradiated with the X-rays, an electric passage is formed between the opposing detector substrate 1202 and the element substrate 1203, making it possible to measure the current that flows from the pixel electrode possessed by the pixel formed on the element substrate 1203 to the opposing detector electrode formed on the opposing detector substrate 1202. In this embodiment, the X-rays that have passed through the opposing detector substrate 1202 fall on the pixel that is to be measured on the element substrate 1203 forming an electric passage at a desired position and making it possible to more correctly measure the current.

In the foregoing was described the constitution for moving the element substrate 1203. It is, however, also allowable to conduct the inspection by securing the element substrate 1203 and by interlocking the source 1201 of electromagnetic waves and the opposing detector substrate 1202 together. Further, the opposing detector substrate 1202 may be formed like a ring to permit the passage of the X-rays, or an electrode may be simply provided in the vicinity thereof.

In this Example, the measuring method and the evaluation method are the same as those of Example 1. When it is difficult to focus the X-ray, however, a mirror having a high reflection factor is provided along the periphery as required or a capillary plate is provided so that the X-ray can be projected onto a desired position. It is further desired that the distance is as close as possible between the opposing detector substrate 1202 and the element substrate 1203. The constitution of this Example can be put into practice being freely combined with the constitutions of Examples 1 to 3.

EXAMPLE 5

Examples 1 to 4 have dealt with the substrates on which the TFTs were formed as element substrates. The invention, however, can be put into practice even by using MOS transistors formed on the semiconductor substrate instead of the TFTs. For example, the semiconductor substrate (typically, a silicon wafer) on which the MOS transistors are formed can be inspected as the element substrate.

According to this Example, the element substrate can be inspected by any one of the Examples of the invention, the inspection method of Example 3 or the inspection method of Example 4.

EXAMPLE 6

Figure 15:
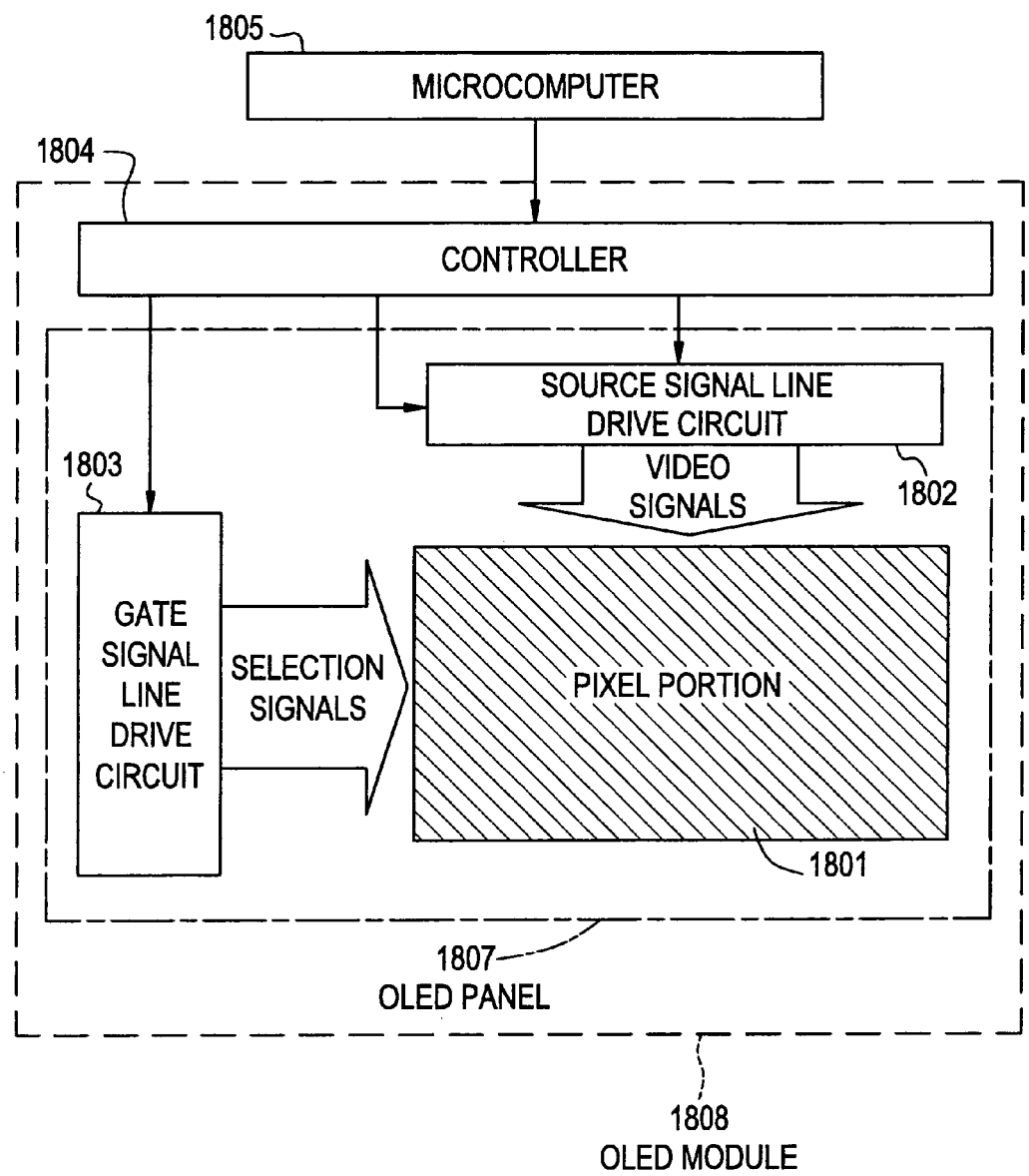
FIG. 15 shows a light-emitting device inspected by the inspection method of this invention.

Described below with reference to FIGS. 15 and 16 are the cases where a connector such as FPC or TAB is connected to the display panel of the invention to ship it as a product.

In FIG. 15, reference numeral 1801 denotes a pixel portion that has passed the inspection method of the invention, and that is provided with plural pixels.

Reference numeral 1802 denotes a source signal line drive circuit, and 1803 denotes a gate signal line drive circuit. In response to selection signals output from the gate signal line drive circuit 1803, video signals output from the source signal line drive circuit 1802 are input to the specified pixels of the pixel portion 1801. The video signals may be either digital signals or analog signals. Further, the source signal line drive circuit 1802 and the gate signal line drive circuit 1803 may be provided in any number.

In this specification, an OLED panel 1807 refers to a module that includes a drive circuit constituted by the source signal line drive circuit 1802 and the gate signal line drive circuit 1803, the pixel portion 1801, and a connector for connecting the wiring possessed by the pixel portion 1801 and for connecting the wiring possessed by the drive circuit to an external unit. The OLED panel 1807 needs not necessarily be provided with the drive circuit, and the pixel portion 1801 and the wiring possessed by the pixel portion 1801 may be separately formed.

Figure 16A:
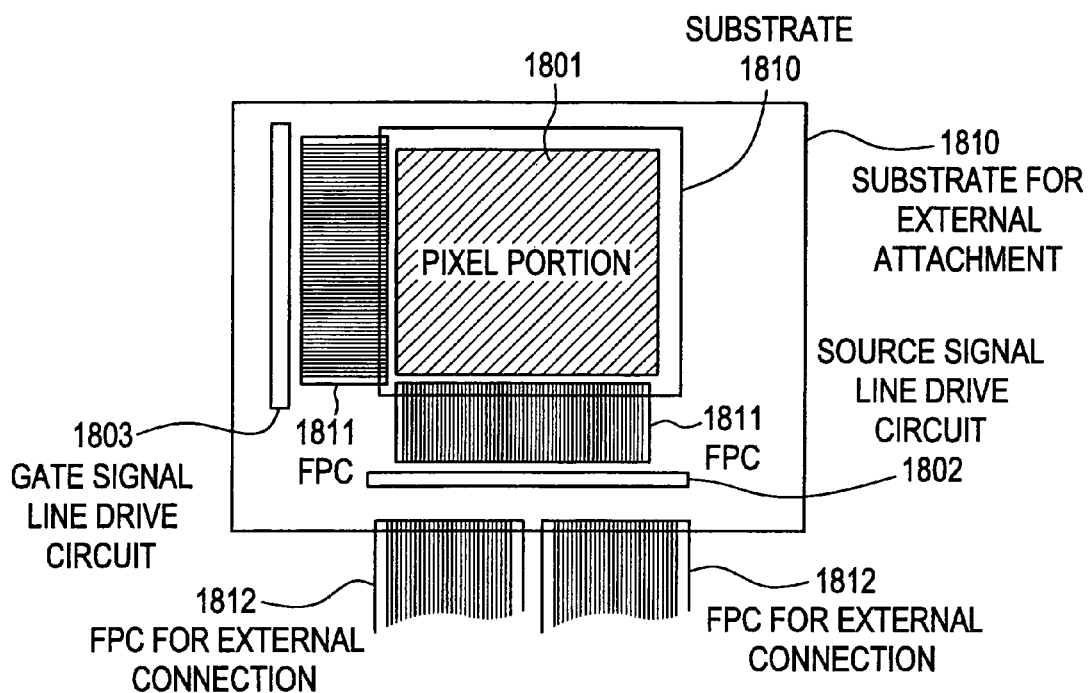
FIG. 16(A) and 16(B) show light-emitting devices inspected by the inspection method of this invention.

Here, the OLED panel in which the drive circuit and the pixel portion 1801 are provided on the separate substrates and are connected together by a connector such as FPC or TAB, is called an OLED panel of the externally attached type, and the OLED panel in which the drive circuit-and the pixel portion 1801 are provided on the same substrate is called an OLED panel of the integral type. FIG. 16(A) shows an OLED panel of the externally attached type, and FIG. 16(B) shows an OLED panel of the integral type.

FIG. 16(A) is a top view of the OLED panel of the externally attached type. The pixel portion 1801 is provided on the substrate 1810, and the wirings possessed by the pixel portion 1801 are connected to the source signal line drive circuit 1802 and to the gate signal line drive circuit 1803 formed on the substrate 1812 for external attachment via FPCs 1811. Wirings of the source signal line drive circuit 1802, of the gate signal line drive circuit 1803 and of the pixel portion 1801 are connected to an external unit through the FPC 1812 for external connection.

Figure 16B:
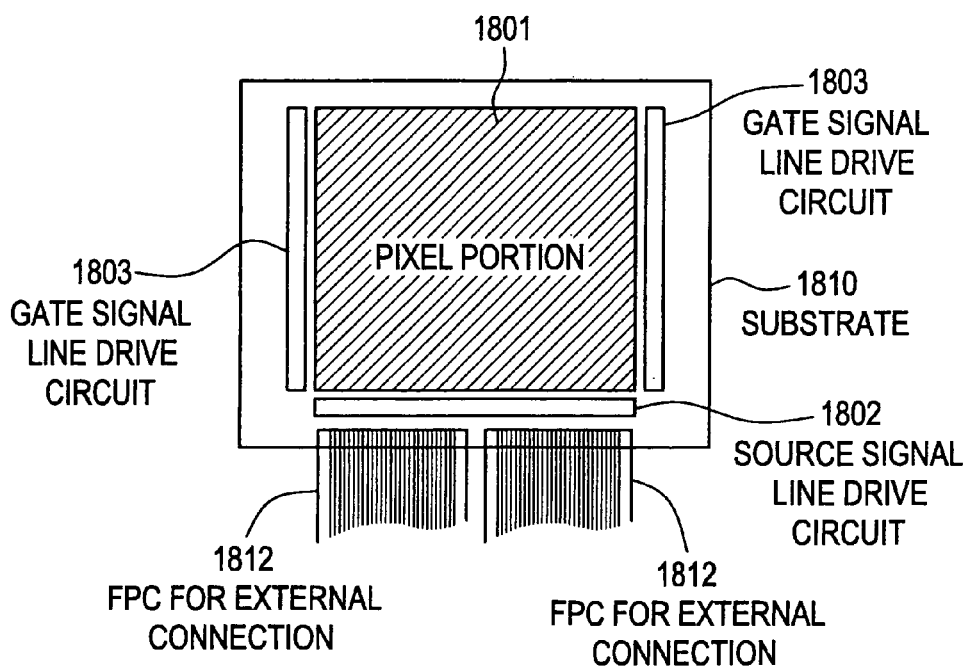

FIG. 16(B) is a top view of the OLED panel of the integral type. On the substrate 1810 are provided the pixel portion 1801, source signal line drive circuit 1802 and gate signal line drive circuit 1803. The wirings of the pixel portion 1801, of the source signal line drive circuit 1802 and of the gate signal line drive circuit 1803 are connected to an external unit through the FPCs 1812 for external connection.

In FIG. 15, reference numeral 1804 denotes a controller having a function for driving the drive circuit and for displaying an image on the pixel portion 1801. The controller 1804 works to send signals containing image data input from an external unit to the source signal line drive circuit 1802, to form signals (e.g., clock signals (CLK), start pulse signal (SP)) for driving the drive circuit, and works as a power source for feeding a potential to the drive circuit and to the pixel portion 1801.

In this specification, an OLED module 1808 refers to a module that includes the drive circuit, pixel portion 1801, controller 1804, pixel portion 1801, drive circuit, controller, and connectors for connecting the wirings thereof to the external unit. The OLED module 1808 is the one in which the OLED panel 1807 is provided with the drive circuit and the controller 1804.

Reference numeral 1805 denotes a microcomputer for controlling the controller 1804. In this specification, the module including the microcomputer 1805 and the OLED module 1808 is called OLED module 1809 with microcomputer.

In practice, the OLED panel 1807, the OLED module 1808 and the OLED module 1809 with microcomputer are shipped as products. In this specification, the OLED panel 1807, OLED module 1808 and OLED module 1809 with microcomputer are all regarded as light-emitting devices.

The light-emitting device of this Example can employ the method of fabrication and inspection method dealt with in Example 1 and can further employ the constitution of pixel portion same as that of Example 2. The device can be further inspected by the inspection method described in Example 3 or 4, and to which can be applied the element substrate of Example 5.

EXAMPLE 7

The invention can be put into practice even when plural element substrates are to be simultaneously formed on a large substrate.

In this case, the drive circuit formed separately from the element substrate, the opposing detector substrate and source of electromagnetic waves may be interlocked together and may be moved onto the element substrate that is to be inspected. Further, the element substrate only may be moved to conduct the inspection.

In inspecting plural element substrates, the electric connection must be made again between the element substrate to be inspected and the drive circuit for every inspection. The connection terminals on the side of the element substrate used in this case may include terminals for inspection. It is, however, also allowable to use terminals that are finally connected to the external unit through the FPC.

EXAMPLE 8

A light-emitting device formed by implementing examination method of the present invention has superior visibility in bright locations in comparison to a liquid crystal display device because it is a self-emission type device, and moreover its field of vision is wide. Accordingly, it can be used as a display portion for various electronic devices. For example, it is appropriate to use the light-emitting device formed by implementing the examination method of the present invention as a display portion of a display having a diagonal equal to 30 inches or greater (typically equal to 40 inches or greater) for-appreciation of TV broadcasts by large screen.

Note that all displays exhibiting (displaying) information such as a personal computer display, a TV broadcast reception display, or an advertisement display are included as the light-emitting device. Further, the light-emitting device using the examination method of the present invention can be used as a display portion of the other various electronic devices.

The following can be given as examples of such electronic devices of the present invention: a video camera; a digital camera; a goggle type display (head mounted display); a navigation system; an audio reproducing device (such as a car audio system, an audio compo system); a notebook personal computer; a game equipment; a portable information terminal (such as a mobile computer, a mobile telephone, a mobile game equipment or an electronic book); and an image playback device provided with a recording medium (specifically, a device which performs playback of a recording medium and is provided with a display which can display those images, such as a digital video disk (DVD)). In particular, because portable information terminals are often viewed from a diagonal direction, the wideness of the field of vision is regarded as very important. Thus, it is preferable that the light-emitting device is employed. Examples of these electronic-devices are shown in FIGS. 13 and 14.

Figure 13A:
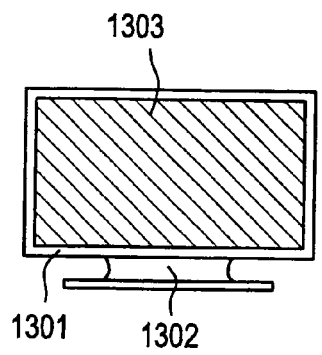
FIGS. 13A-F show electric appliances using the light-emitting device.

FIG. 13A is a display for displaying, containing a casing 1301, a support stand 1302, and a display portion 1303. The light-emitting device which is applied the examination method of the present invention can be used in the display portion 1303. Since the light-emitting is a self-emission type device with no need of a back light, its display portion can be made thinner than a liquid crystal display device.

Figure 13B:
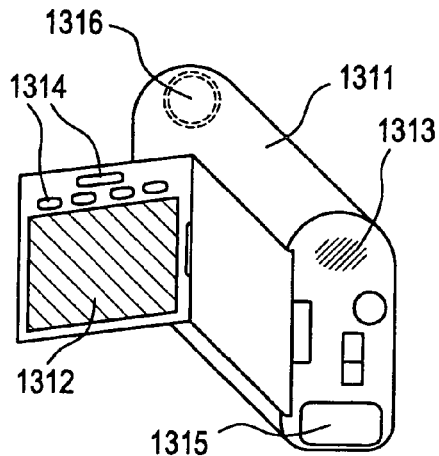

FIG. 13B is a video camera, containing a main body 1311, a display portion 1312, an audio input portion 1313, operation switches 1314, a battery 1315, and an image receiving portion 1316. The light-emitting device which is applied to the examination method of the present invention can be used in the display portion 1312.

Figure 13C:
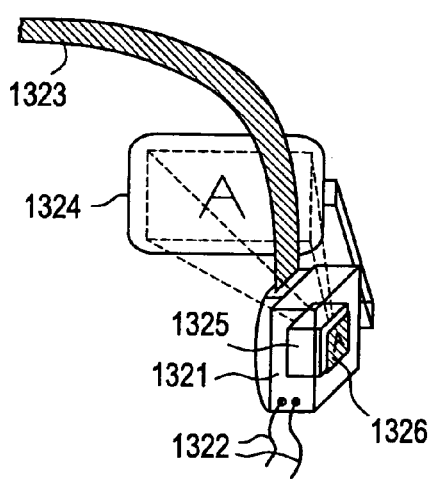

FIG. 13C is a portion of a head mounted type electrical appliance (right side), containing a main body 1321, a signal cable 1322, a head fixing band 1323, a screen portion 1324, an optical system 1325, and a display portion 1326. The light-emitting device which is applied the examination method of the present invention can be used in the display portion 1326.

Figure 13D:
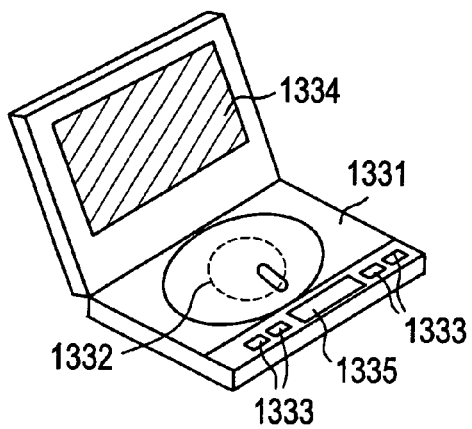

FIG. 13D is an image playback device (specifically, a DVD playback device) provided with a recording medium, containing a main body 1331, a recording medium (such as a DVD) 1332, operation switches 1333, a display portion (a) 1334, and a display portion (b) 1335. The display portion (a) 1334 is mainly used for displaying image information, and the display portion (b) 1335 is mainly used for displaying character information, and the light-emitting device which is applied to the examination method of the present invention can be used in the display portion (a) 1334 and in the display portion (b) 1335. Note that domestic game equipment is included as the image playback device provided with a recording medium.

Figure 13E:
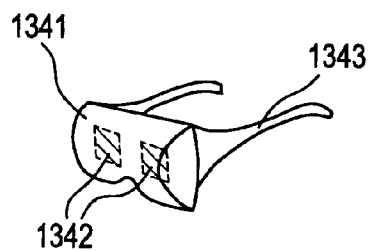

FIG. 13E is a goggle type display device (head mounted display), containing a main body 1341, a display portion 1342, and arm portion 1343. The light-emitting device which is applied the examination method of the present invention can be used in the display portion 1342.

Figure 13F:
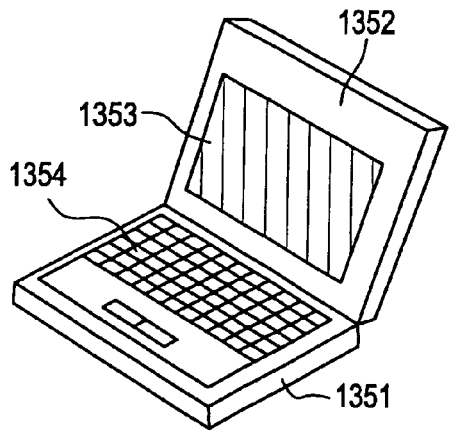

FIG. 13F is a personal computer, containing a main body 1351, a casing 1352, a display portion 1353, and a keyboard 1354. The light-emitting device which is applied the examination method of the present invention can be used in the display portion 1353.

Note that if the emission luminance of EL materials becomes higher in the future, it will be possible to use the light-emitting device of the present invention in a front type or a rear type projector by projecting light including output images, which can be enlarged by lenses or the like.

The above electrical appliances are becoming more often used to display information provided through an electronic telecommunication line such as the Internet or CATV (cable television), and in particular, opportunities for displaying animation information are increasing. The response speed of EL materials is extremely high, and therefore the light-emitting device is favorable for performing animation display.

Since the light emitting portion of the light-emitting device consumes power, it is preferable to display information so as to have the emitting portion become as small as possible. Therefore, when using the light-emitting device in a display portion which mainly displays character information, such as a portable information terminal, in particular, a portable telephone and an audio reproducing device, it is preferable to drive it by setting non-emitting portions as background and forming character information in emitting portions.

Figure 14A:
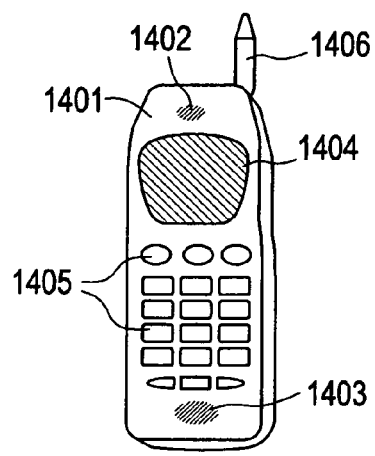
FIGS. 14A-C show electric appliances using the light emitting device.

FIG. 14A is a portable telephone, containing a main body 1401, an audio output portion 1402, an audio input portion 1403, a display portion 1404, operation switches 1405, and an antenna 1406. The light-emitting device of the present invention can be used in the display portion 1404. Note that by displaying white characters in a black background in the display portion 1404, the power consumption of the portable telephone can be reduced. Further, in the case where periphery is dark, it is effective that the power consumption can be reduced by decreasing the applied voltage, thereby lowering luminance.

Figure 14B:
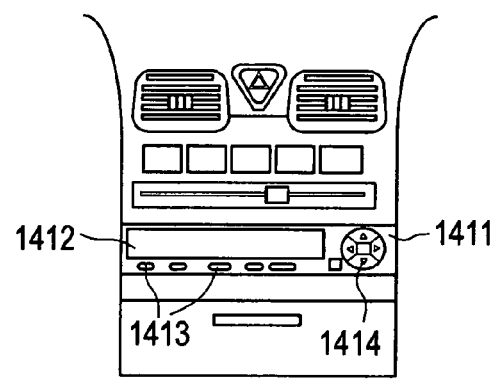

FIG. 14B is an audio reproducing device, specifically a car audio system, containing a main body 1411, a display portion 1412, and operation switches 1413 and 1414. The light-emitting device of the present invention can be used in the display portion 1412. Furthermore, an audio reproducing device for a car is shown in Embodiment 8, but it may also be used for a portable type and a domestic type of audio reproducing device. Note that by displaying white characters in a black background in the display portion 1412, the power consumption can be reduced. This is particularly effective in a portable type audio reproducing device.

Figure 14C:
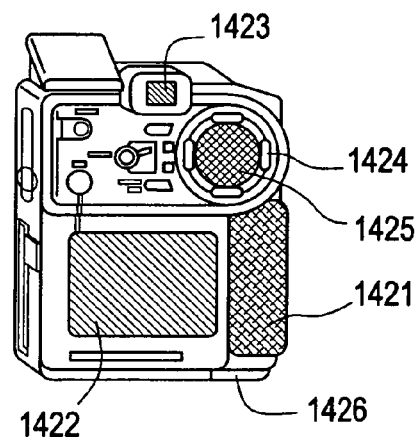

FIG. 14C is a digital camera, containing a main body 1421, a display portion (A) 1422, an eye piece portion 1423, an operation switch 1424, a display portion (B) 1425 and a battery 1426. The EL display device which is applied the examination method of the present invention can be used in the display portion (A) 1422 and the display portion (B) 1425. Note that in the case of using mainly the display portion (B) 1425 as an operation panel, by displaying white characters in a black background, the power consumption of the digital camera can be reduced.

In the case of electrical appliances shown in this embodiment, the sensor portion is provided to perceive the external light and the function to lower the brightness of display when it is used in the dark area as a method to lower the power consumption.

The range of applications of the present invention is thus extremely wide, and it is possible to apply the present invention to electrical appliances in all fields. Furthermore, Embodiment 8 can be implemented in combination of any structures of the Embodiments 1 to 7.

The inspection method of the invention makes it possible to distinguish whether the element substrate is acceptable or defective even without completing the element substrate as a light-emitting device or without really effecting the display and, hence, to remove the defective device from the subsequent production process. Accordingly, the cost of production is decreased and the yield is improved.

What is claimed is:

1. A device for inspecting a semiconductor device including an element substrate comprising:
   an opposing detector substrate;
   a source of an electromagnetic wave comprising a soft X-ray; and
   a shielding plate having a hole and shielding the electromagnetic wave,
   wherein the electromagnetic wave passes through the hole, and
   wherein a gas present between the element substrate and the opposing detector substrate is ionized by the electromagnetic wave.

2. A device for inspecting a semiconductor device according to claim 1 wherein the semiconductor device comprises a transistor.

3. A device for inspecting a semiconductor device according to claim 1 wherein the semiconductor device comprises a wiring.

4. A device for inspecting a semiconductor device according to claim 1 wherein the ionized gas establishes an electric path.

5. A device for inspecting a semiconductor device according to claim 4 wherein a current flows along the electric path.

6. A device for inspecting a semiconductor device according to claim 1 wherein the gas comprises air.

7. A device for inspecting a semiconductor device according to claim 1 wherein the electromagnetic wave has a wavelength of 0.01 to 100 nm.

8. A device for inspecting a semiconductor device according to claim 1, further comprising:
   a mirror for focusing the soft X-ray emitted from the source of the electromagnetic wave.

9. A device for inspecting a semiconductor device including an element substrate comprising:
   an opposing detector substrate;
   a source of an electromagnetic wave comprising a soft X-ray; and
   a shielding plate having a hole and shielding the electromagnetic wave,
   wherein the electromagnetic wave passes through the hole, and
   wherein a gas present between a pixel provided on the element substrate and the opposing detector substrate is ionized by the electromagnetic wave.

10. A device for inspecting a semiconductor device according to claim 9 wherein the semiconductor device comprises a transistor.

11. A device for inspecting a semiconductor device according to claim 9 wherein the semiconductor device comprises a wiring.

12. A device for inspecting a semiconductor device according to claim 9 wherein the ionized gas establishes an electric path.

13. A device for inspecting a semiconductor device according to claim 12 wherein a current flows along the electric path.

14. A device for inspecting a semiconductor device according to claim 9 wherein the gas comprises air.

15. A device for inspecting a semiconductor device according to claim 9 wherein the electromagnetic wave has a wavelength of 0.01 to 100 nm.

16. A device for inspecting a semiconductor device according to claim 9, further comprising:
    a mirror for focusing the soft X-ray emitted from the source of the electromagnetic wave.

17. A device for inspecting a semiconductor device including an element substrate comprising:
    an opposing detector substrate;
    a source of an electromagnetic wave comprising a soft X-ray; and
    a shielding plate having a hole and shielding the electromagnetic wave,
    wherein the electromagnetic wave passes through the hole, and
    wherein a gas present between a pixel provided on the element substrate and the opposing detector substrate is ionized by the electromagnetic wave,
    wherein the shielding plate comprises lead glass.

18. A device for inspecting a semiconductor device according to claim 17 wherein the semiconductor device comprises a transistor.

19. A device for inspecting a semiconductor device according to claim 17 wherein the semiconductor device comprises a wiring.

20. A device for inspecting a semiconductor device according to claim 17 wherein the ionized gas establishes an electric path.

21. A device for inspecting a semiconductor device according to claim 20 wherein a current flows along the electric path.

22. A device for inspecting a semiconductor device according to claim 17 wherein the gas comprises air.

23. A device for inspecting a semiconductor device according to claim 17 wherein the electromagnetic wave has a wavelength of 0.01 to 100 nm.

24. A device for inspecting a semiconductor device according to claim 17, further comprising:
    a mirror for soft focusing the soft X-ray emitted from the source of the electromagnetic wave.

* * * * *